US011956935B1

(12) United States Patent
Sechrist et al.

(10) Patent No.: US 11,956,935 B1
(45) Date of Patent: Apr. 9, 2024

(54) SENSE AND REACT TUNABLE RADIO FREQUENCY SYSTEMS

(71) Applicant: The United States of America, as represented by the Secretary of the Navy, Arlington, VA (US)

(72) Inventors: Zachary A. Sechrist, Alexandria, VA (US); Christopher G. Yelton, Ridgecrest, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 305 days.

(21) Appl. No.: 17/583,854

(22) Filed: Jan. 25, 2022

(51) Int. Cl.
*G01R 29/08* (2006.01)
*G01R 29/10* (2006.01)
*H01Q 1/36* (2006.01)
*H01Q 1/38* (2006.01)
*H05K 9/00* (2006.01)
*H01Q 13/02* (2006.01)

(52) U.S. Cl.
CPC ....... *H05K 9/0081* (2013.01); *G01R 29/0878* (2013.01); *G01R 29/10* (2013.01); *H01Q 1/364* (2013.01); *H01Q 1/38* (2013.01); *H05K 9/0094* (2013.01); *H01Q 13/02* (2013.01)

(58) Field of Classification Search
CPC .... G01R 29/0878; G01R 29/10; H01Q 1/364; H01Q 1/38; H01Q 13/02; H05K 9/0081; H05K 9/0094
See application file for complete search history.

(56) References Cited

U.S. PATENT DOCUMENTS

| 10,224,762 | B2 * | 3/2019 | Wang | B60L 53/124 |
| 10,768,216 | B2 * | 9/2020 | Abadie | G01R 29/0821 |
| 10,777,883 | B2 * | 9/2020 | Coleman | H01Q 21/064 |
| 11,041,936 | B1 * | 6/2021 | Wall | H01Q 1/425 |
| 11,764,466 | B1 * | 9/2023 | Sechrist | H01Q 1/38 |
| | | | | 343/700 R |

FOREIGN PATENT DOCUMENTS

| CN | 108008414 A | * | 5/2018 | |
| CN | 108353081 A | * | 7/2018 | H04K 3/44 |
| CN | 114489148 B | * | 8/2023 | |

* cited by examiner

*Primary Examiner* — Vibol Tan
(74) *Attorney, Agent, or Firm* — Naval Air Warfare Center Weapons Division; James M. Saunders

(57) ABSTRACT

The embodiments are directed to protecting objects having sensitive electronics from high power radio frequency (HPRF) interference signals. An object with the sensitive electronics has a thin film applied to the object's outer surface. The thin film conforms to the object's outer surface contours. The thin film has a substrate foundation, an array in intimate adjacent contact with the substrate foundation. The array has a plurality of radio frequency (RF) witness films overlain on the substrate foundation. Each RF witness film in the plurality of RF witness films is equally-spaced from adjacent RF witness films.

13 Claims, 14 Drawing Sheets

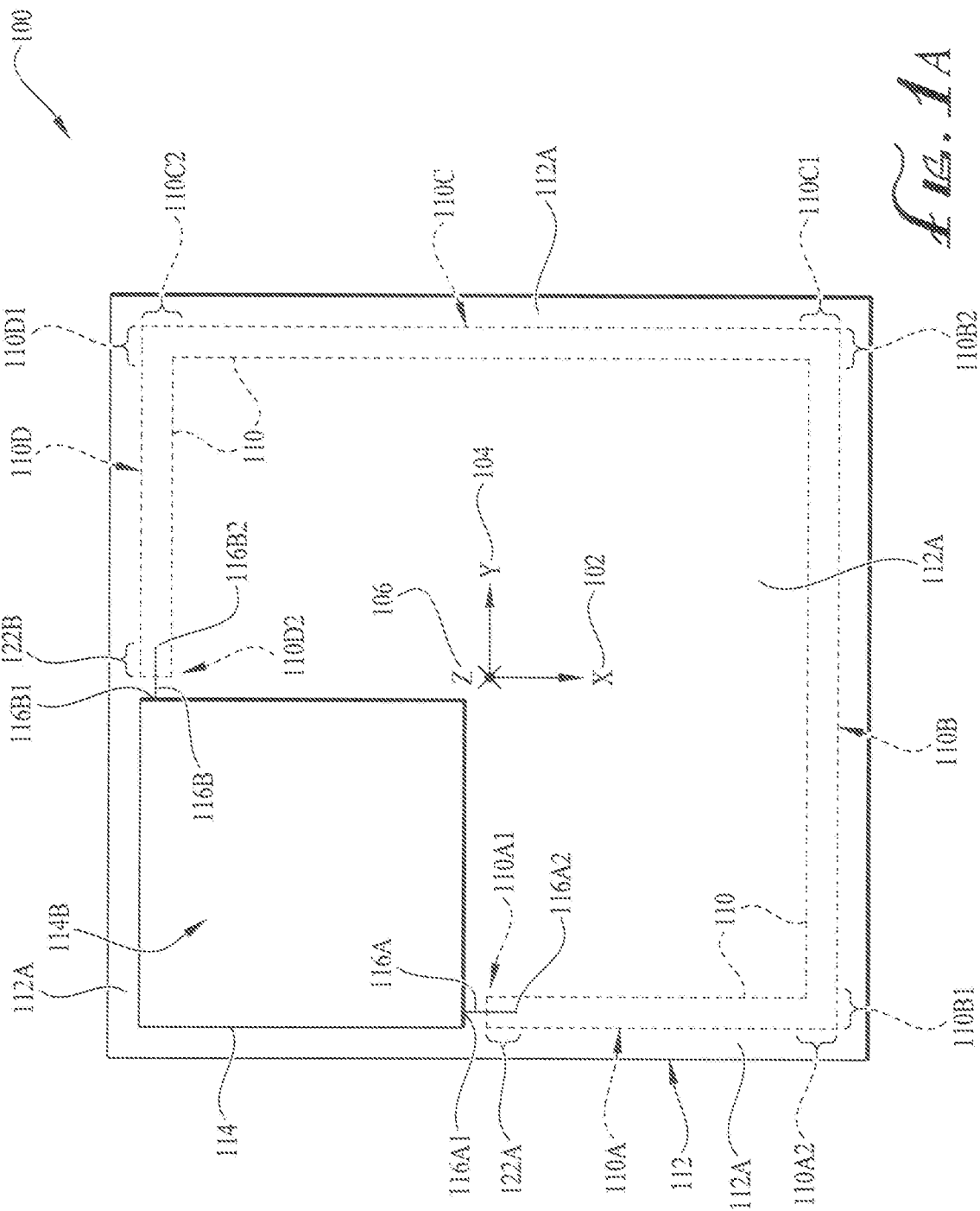

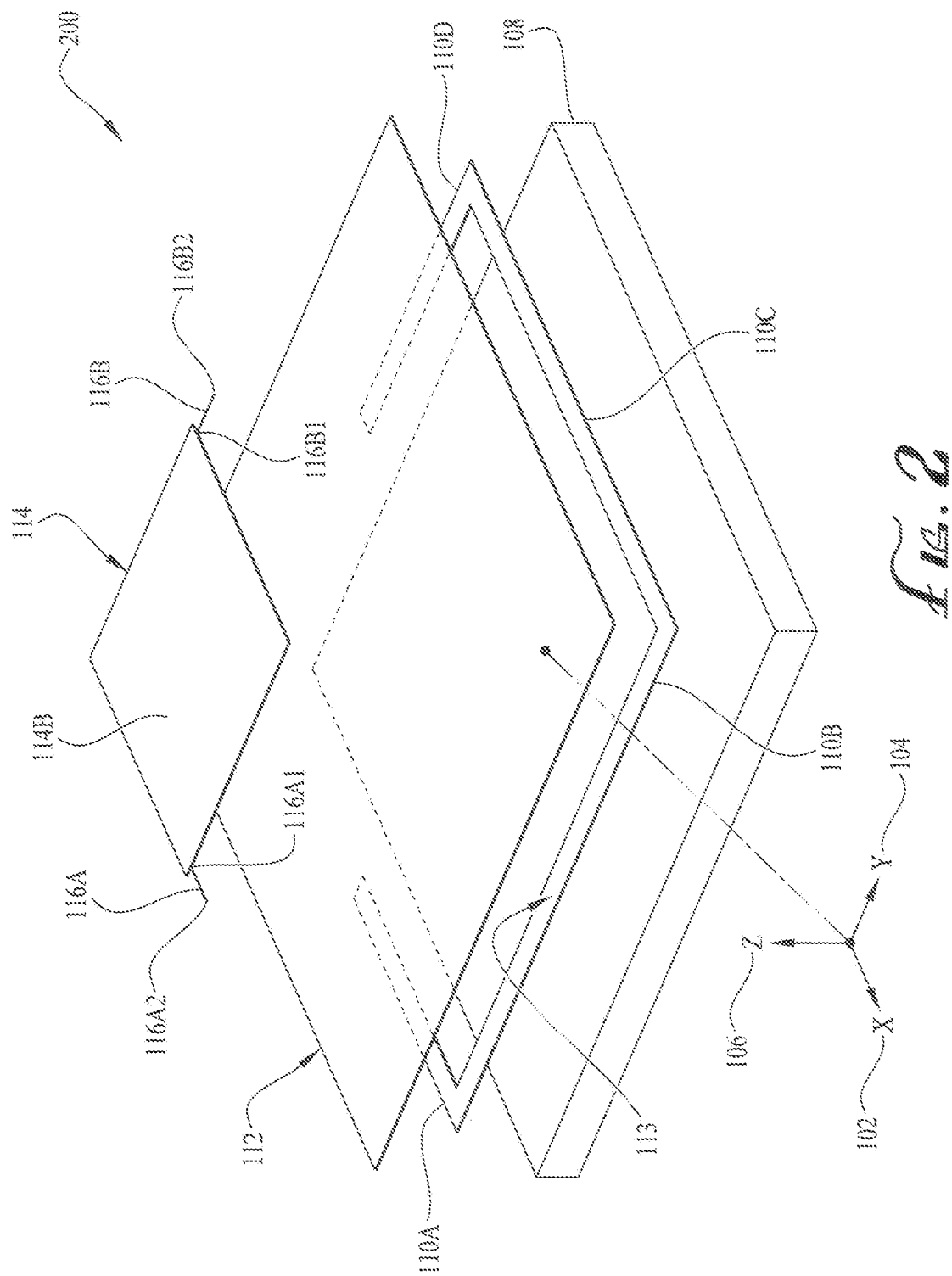

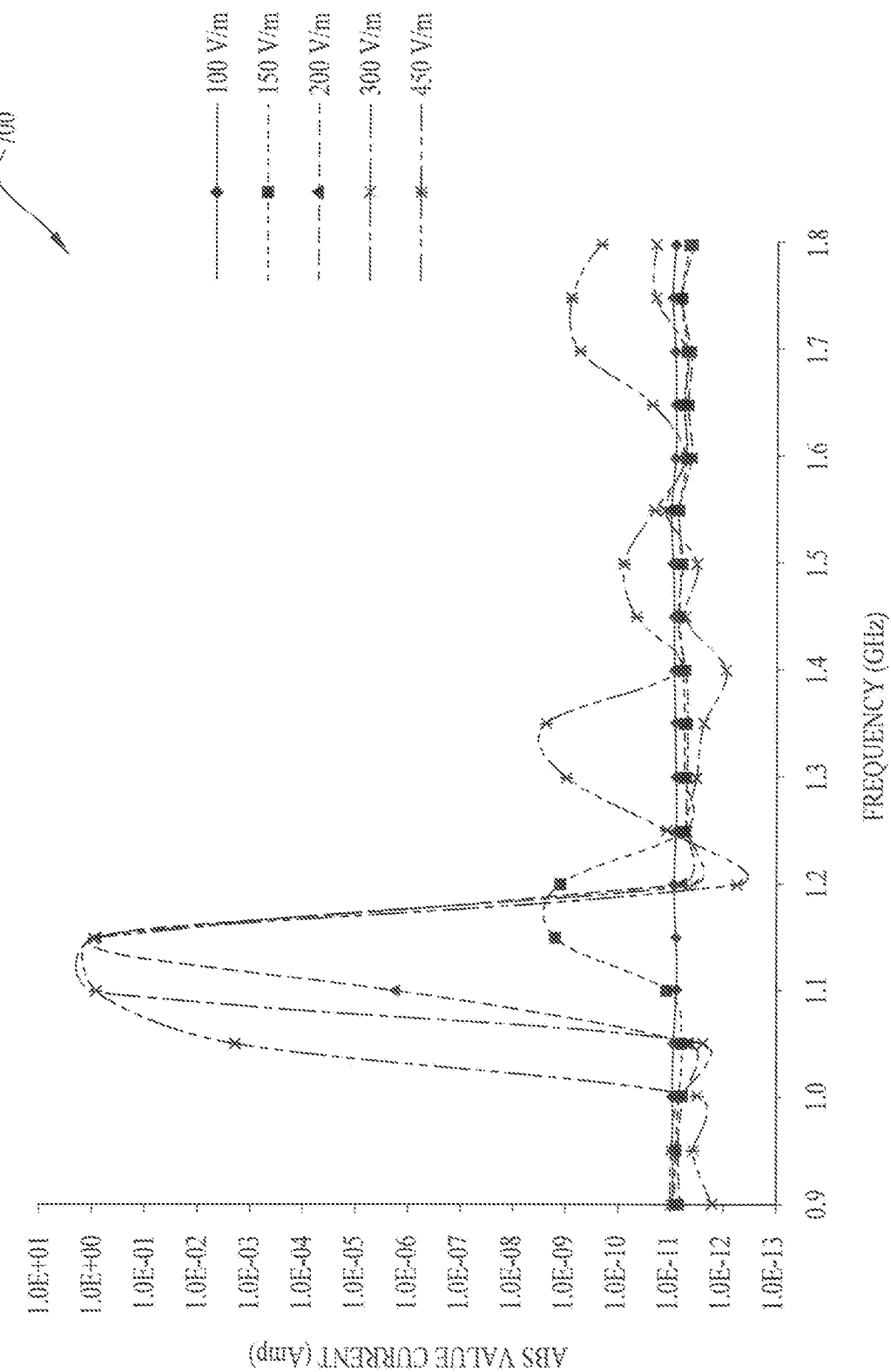

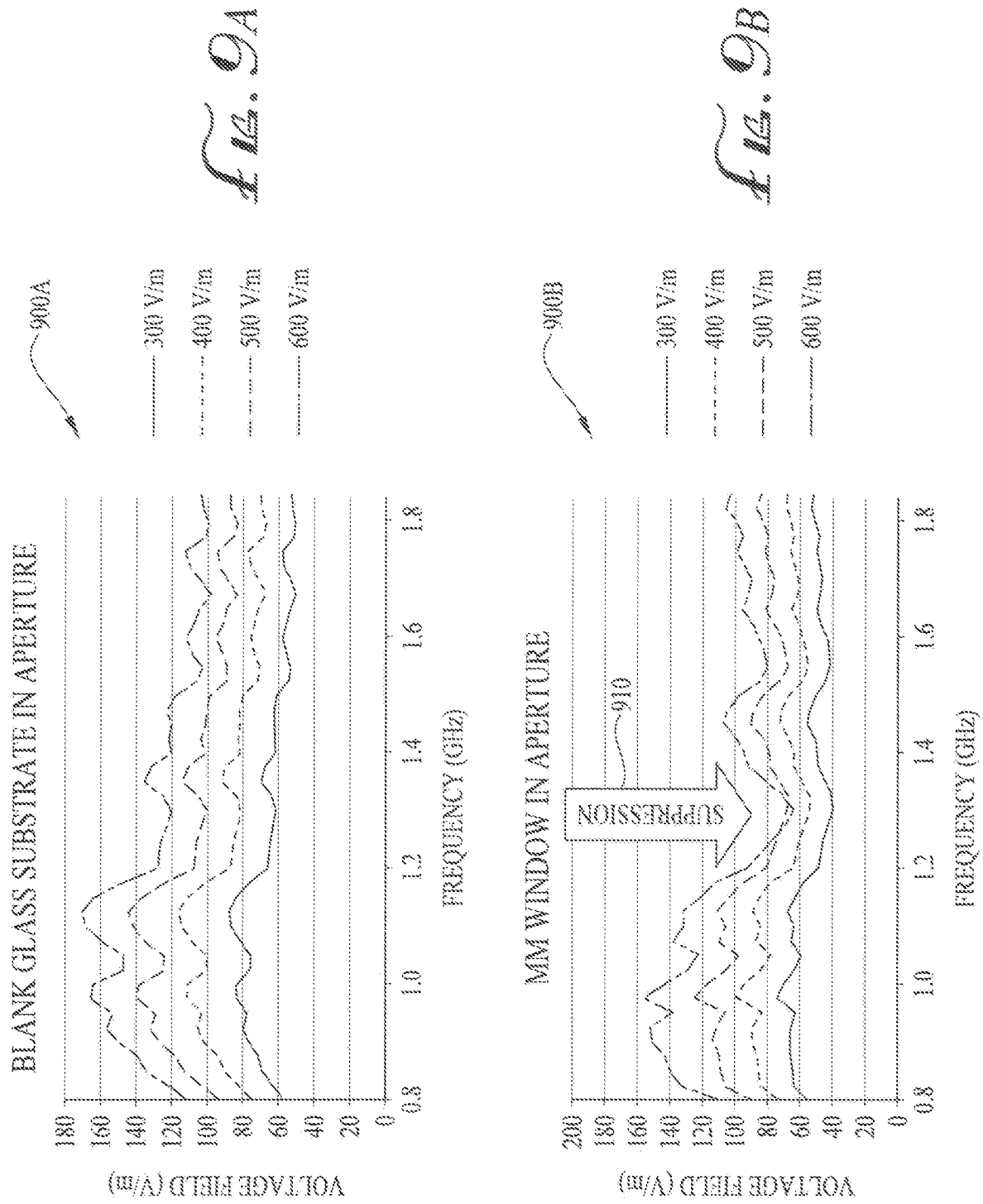

SENSE AND REACT TUNABLE RADIO FREQUENCY SYSTEMS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor. The subject matter of this invention is related to work conducted under Navy contract N0001416WX00035.

FIELD

Embodiments generally relate to sensors and, in particular, sensors to prevent damage from unplanned high power radio frequency (HPRF) signals.

BRIEF DESCRIPTION OF THE DRAWINGS

FIG. 1A illustrates a plan view of a radio frequency (RF) witness film, sometimes referred to as a unit cell, according to some embodiments.

FIG. 2 illustrates an isometric assembly view of the RF witness film depicted in FIG. 1A.

FIG. 7 illustrates a graphical depiction of the resulting tunneling current as a function of incident radiation frequency and field strength for the system under test in FIG. 6 at a 100 volts per meter DC offset voltage.

FIG. 8 depicts close-up views of non-reversible breakdown in the system under test from FIG. 6 and the incident electric field threshold for breakdown as a function of DC offset voltage.

FIG. 9A depicts the response with a blank glass substrate in the aperture. FIG. 9B depicts the response with a metamaterial window in the aperture, according to some embodiments.

FIG. 10A depicts the response with a blank glass substrate in the aperture. FIG. 10B depicts the response with a metamaterial window in the aperture, according to some embodiments.

Figure 1B:
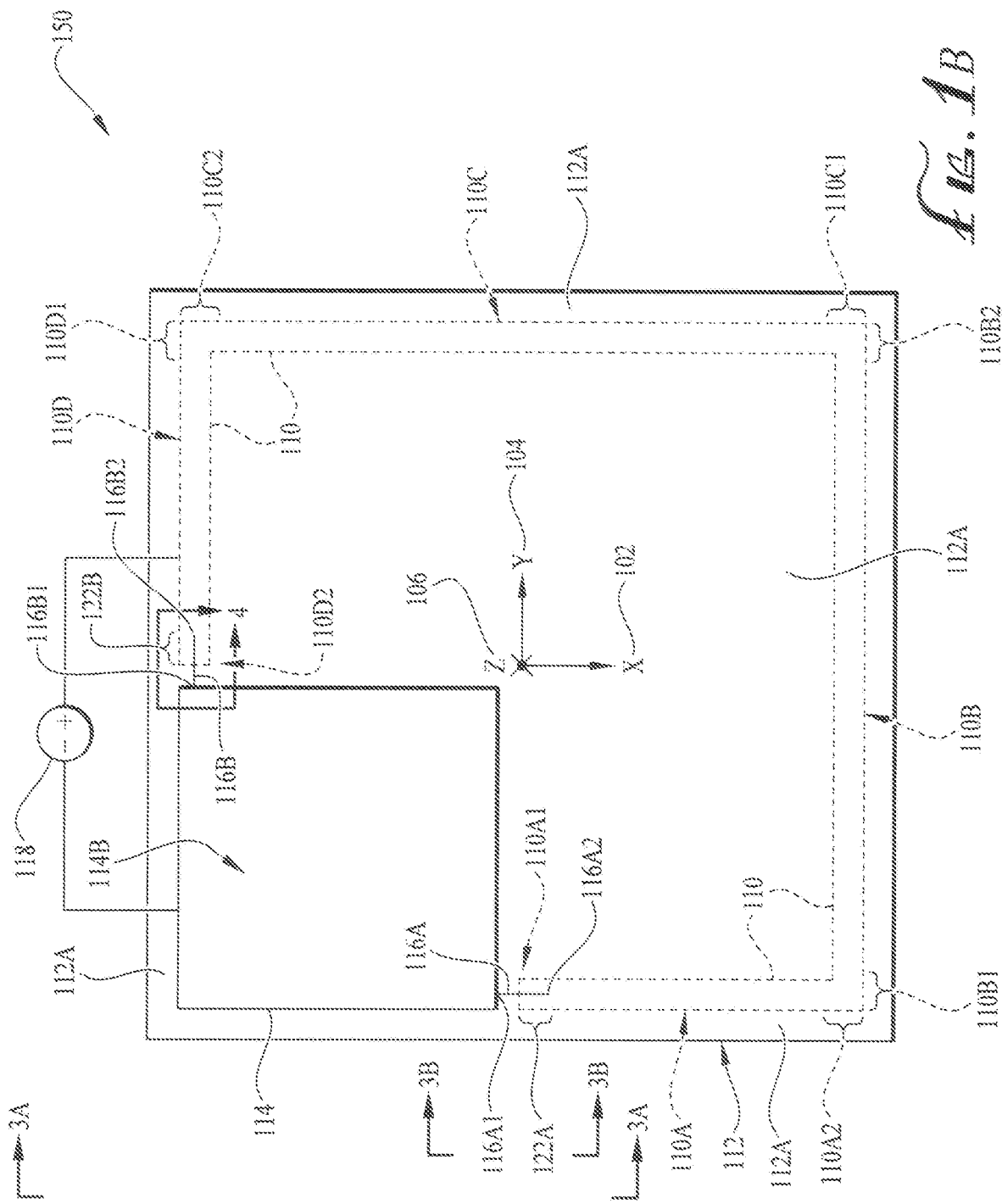
FIG. 1B illustrates a plan view of the unit cell and a direct current offset voltage, according to some embodiments.

It is to be understood that the foregoing general description and the following detailed description are exemplary and explanatory only and are not to be viewed as being restrictive, as claimed. Further advantages will be apparent after a review of the following detailed description of the disclosed embodiments, which are illustrated schematically in the accompanying drawings and in the appended claims.

DETAILED DESCRIPTION OF EMBODIMENTS

Embodiments may be understood more readily by reference in the following detailed description in connection with the accompanying figures and examples. It is understood that embodiments are not limited to the specific devices, methods, conditions or parameters described and/or shown herein, and that the terminology used herein is for the purpose of describing particular embodiments by way of example only and is not intended to be limiting of the claimed embodiments.

The embodiments are generally directed to sensing electromagnetic energy and, in particular, radio frequency (RF) signals imparted on a metamaterial surface. The embodiments are physical structures that are constructed for the protection of objects. In particular, the embodiments are configured to protect those objects from unplanned high power radio frequency (HPRF) interference, sometimes referred to as HPRF interference signals, HPRF signals, directed energy, or imparted electromagnetic radiation. Characteristics of the embodiments are based on the geometry of components coupled with tunneling current within the structures. The constituent components used collect electromagnetic radiation and build up an electronic potential using electron tunneling across a capacitive element to introduce loss and tune the resonant frequency of a metamaterial unit cell and arrays of the same.

Although the embodiments are described in considerable detail, including references to certain versions thereof, other versions are possible. Examples of other versions include varying component orientation or hosting embodiments on different platforms. Therefore, the spirit and scope of the appended claims should not be limited to the description of versions included herein.

Conventions, Parameters, and Terminology

At the outset, it is helpful to describe various conventions, parameters, and terminology associated with the embodiments.

Electron Tunneling

The embodiments make use of "electron tunneling." A person having ordinary skill in the art will recognize that electron tunneling is a phenomenon between two metal layers in such fashion that electrons pass from one metal layer, and through a layer that electrons normally will not travel, such as a dielectric layer 112 or insulator. The dielectric layer 112 is sometimes considered by those having ordinary skill in the art to be a quantum mechanically forbidden zone. However, as configured, the embodiments pass the electrons through the dielectric layer 112 and then into a second metal layer. A person having ordinary skill in the art will recognize that that room temperature nonlinear tunneling effect driven by electric field is called Fowler-Nordheim (FN) tunneling. FN tunneling is a well-established contributor to capacitor leakage current in thin film capacitors. However, the disclosed embodiments are novel for several reasons, including their use of electron tunneling to create sense and react RF components. The term "tunneling current" is sometimes used interchangeably herein for the electron tunneling.

Sputter Deposition

Various layered structures are used to construct the embodiments. One technique used is "sputter deposition." Sputter deposition is understood by one having ordinary skill in the art to be a physical vapor deposition method of thin film deposition by sputtering. Radio frequency (RF) sputtering was also used. A person having ordinary skill in the art will recognize that RF sputtering is used in environments where the sign of the anode-cathode bias is varied at a high rate, such as environments greater than 13 MHz.

Spin Coating

The embodiments also employed "spin coating" techniques. Spin coating is understood to be a procedure to deposit uniform thin film materials onto generally flat substrates. A person having ordinary skill in the art will recognize that spin coating can include spinning a substrate layer at high angular velocities. In particular, the technique is used to deposit photoresist layers.

Sigmoid Shape

The embodiments include geometrical arrangements and shapes of components. In particular, some embodiments describe a dielectric layer (shown as reference character 112 in the figures) as having a sigmoid shape, A person having ordinary skill in the art will understand that the dielectric layer 112 has surface contours having a "sigmoid" shape or ogee shape. Additionally, a person having ordinary skill in the art will recognize that ogee is a type of sigmoid shape. It is understood in the art that a sigmoid shape is a shape similar to the letter S. Likewise, an ogee shape is understood to be descriptive of an S-shape and, moreover, is characteristic of two curves meeting at a point.

Substantially

As used herein, unless otherwise specified, the term "substantially" refers to the complete, or nearly complete, extent or degree of an action, characteristic, property, state, structure, item, or result. As an arbitrary example, an object that is "substantially" surrounded would mean that the object is either completely surrounded or nearly completely surrounded. The exact allowable degree of deviation from absolute completeness may in some cases depend on the specific context. However, generally speaking, the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As another arbitrary example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

Electromagnetic Energy

As used herein, the term "electromagnetic energy," sometimes referred to as "electromagnetic radiation," and similar terms, refers to energy emanating from oscillation of transverse electric and magnetic fields. Electromagnetic radiation is generally characterized by a wave of disturbance of wavelength, $\lambda$, which is the distance between peaks of the wave for a given frequency, which may be the number of occurrences the wave returns to its original displacement per unit time as it passes a fixed point. The velocity of a radiating electromagnetic wave is the speed of light, c, which is related the wavelength and frequency according to c=lambda*f Electromagnetic radiation may include, without limitation, electromagnetic fields and electromagnetic signals such as radar transmit and receive signals.

Apparatus, System, and Method Embodiments—FIGS. 1A through 4, 6, 12A, & 12B

In the accompanying drawings, like reference numbers indicate like elements. For all embodiments and figures, it is understood that the figures are not to scale and are depicted for ease of viewing. Reference characters 100, 150, 600, 601, 1200, and 1250 depict various embodiments, sometimes referred to as mechanisms, apparatus, devices, systems, and similar terminology. Several views are presented to depict some, though not all, of the possible orientations of the embodiments.

FIG. 1A depicts a plan view of a radio frequency (RF) witness film 100. The RF witness film 100 can also be referred to as an apparatus, a sensor, a unit cell, a single unit cell, an RF witness film unit cell, a unit cell sensor, and similar terminology. In particular, because FIG. 1A depicts a single RF witness film 100, the unit cell terminology is used interchangeably. The unit cell 100 is substantially-square in plan view and is defined in a three-dimensional coordinate frame of reference defined by an x-axis 102, a y-axis 104, and a z-axis 106, with the unit cell 100 centered at the origin.

Figure 3A:
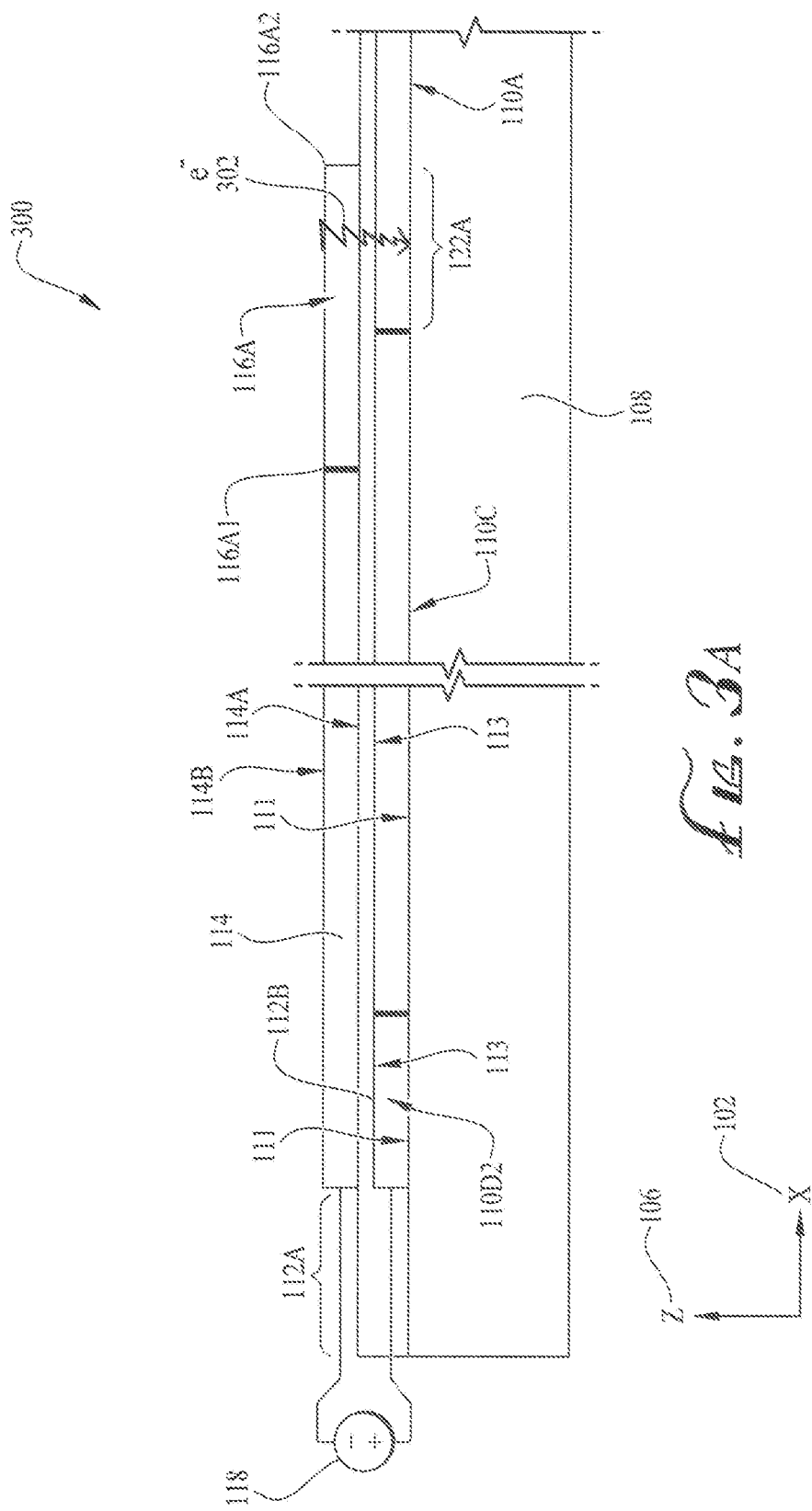
FIG. 3A illustrates a partial side view along the y-axis for the area delineated in FIG. 1B.
Figure 3B:
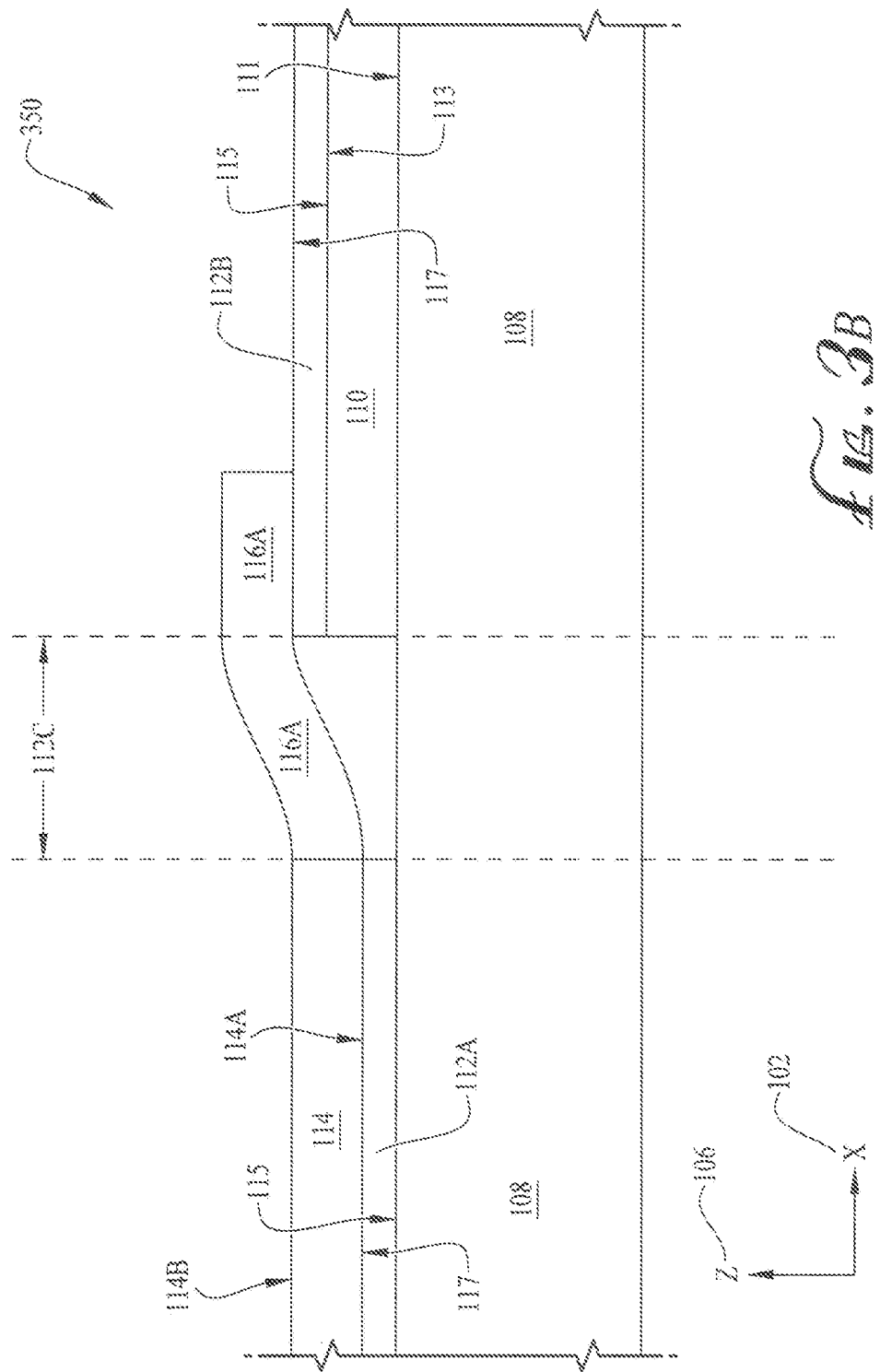
FIG. 3B illustrates a close-up partial side view along the y-axis for the area delineated in FIG. 1B.

FIG. 1B shows a plan view, depicted by reference character 150, of the RF witness film 100 from FIG. 1A with an optional direct current (DC) offset voltage source 118. FIG. 2 shows an isometric assembly view, depicted with reference character 200, of the unit cell 100 from FIG. 1A. FIG. 2 is especially useful in viewing the layer-by-layer components used to construct the unit cell/RF witness film 100. Reference character 300 is used to depict the partial side view in FIG. 3A. The partial side view 300 shows the unit cell 100 looking into the page, along the y-axis 104, for the area delineated in FIG. 1B. Reference character 350 depicts a close-up partial side view of the unit cell 100 looking into the page, along the y-axis 104, for the area delineated in FIG. 1B. Referring to FIGS. 1A through 3B is helpful in identifying the various features. As shown in FIG. 3A, the unit cell 100 is generally constructed of substantially-flat layers, with some variation due to deposition and when viewed closely as shown in FIG. 3B.

Referring to the FIGS. A, 1B, and 3A, the unit cell 100 has a substrate 108 (visible in FIG. 3A). A first conductor 110, sometimes referred to as a first conductive layer or first metal layer, is in intimate adjacent contact with the substrate 108. Additional substrate 108 material is shown on the outside edges of the unit cell which provides stability during layer deposition. An insulator 112, also referred to as a dielectric and dielectric layer, has two portions—a first portion 112A and a second portion 112B. The first portion 112A is in intimate adjacent contact with the substrate 108. The second portion 112B is in intimate adjacent contact with the first conductive layer 110. Reference character 112 is used when referring generally to the dielectric layer, such as in the isometric assembly view in FIG. 2. However, most instances refer to the first and second portions 112A and 112B in describing structural features.

A second conductor 114, also referred to as a conductive layer and second metal layer, has a first side 114A and a second side 114B, with the first side being in intimate adjacent contact with the first portion 112A of the dielectric layer 112. Reference character 114 is used when referring generally to the second conductive layer 114, such as in FIGS. 1A through 2. However, many instances refer to the first and second sides 114A and 114B to describe structural features. The second conductive layer 114 has at least two microstrip extensions, referred to as first microstrip extension 116A and a second microstrip extension 116B (viewable in FIGS. 1A, 1B, and 2) perpendicular to each other in the x-y plane. FIG. 3A only depicts the first microstrip 116A for ease of viewing. FIG. 1B includes an optional direct current (DC) offset voltage 118, commonly referred to as a DC battery, or DC power source. The DC offset voltage 118 is electrically-connected between the first and second conductive layers 110 and 114, respectively. The use of a DC offset voltage 118 is one way of tuning the RF witness film 100 adjust sensitivity of the RF witness film and get closer to breakdown conditions.

The first conductive layer 110 has four strip segments—first, second, third, and fourth strip segments 110A, 110B, 110C, and 110D, respectively. The four strip segments 110A through 110D, can sometimes be referred to as "strips," "segments," and the like without detracting from the merits or generalities of the embodiments. The four strip segments 110A through 110D form an incomplete square outline that is about three-quarters of a square strip outline in the x-y plane—sometimes also referred to as three-quarters of one square strip outline, and similar variations without detracting from the merits or generalities of the embodiments. As shown in FIGS. 1A through 2, the four strip segments 110A through 110D are located near the outer edges of the unit cell 100.

Stated another way, the segments 110A through 110D can be viewed as spatially-covering three quadrants in the x-y plane of the unit cell 100, which is especially visible in FIGS. 1A and 1B depicting the x-y plane. Reference character 111 is used for ease of viewing to represent the first side of the four strip segments 110A through 110D. Similarly, reference character 113 is used for ease of viewing to depict the second side of the four strip segments 110A through 110D. It is evident that the first side 111 of each of the four strip segments 110A through 110D is in intimate adjacent contact with the substrate 108.

It is apparent that the dielectric's first portion 112A is an area adjacent to, and defined by, the first through fourth strip segments 110A through 110D, and also interior to, i.e. towards the origin in the x-y plane. The first portion 112A then spans parallel to, i.e. has a thickness in the z-axis 106 direction, from the substrate 108 to the first side 114A of the second conductive layer 114. Additionally, the dielectric layer's second portion 112B is an area in intimate adjacent contact with, and defined by, each of the second sides 113 of the first through fourth strip segments 110A through 110D in the x-y plane. Thus, the second portion 112B of the dielectric layer 112 is overlain and in intimate adjacent contact with each of the second sides 113 of the first through fourth strip segments 110A through 110D. The second portion 112B then spans parallel to, i.e. has a thickness in the z-axis 106 direction, to the elevation of the first side 114A of the second conductive layer 114. In layman's terms, the second portion 112B is the region in contact with the second sides 113 of the first through fourth strip segments 110A through 110D in the x-y plane and then spanning to the z-axis 106 elevation of the first side 114A of the second conductive layer 114.

Each of the four strip segments 110A through 110D have proximal and distal ends. For completeness, the first strip segment 110A has a proximal 110A1 and a distal end 110A2. The second strip segment 110B has a proximal 110B1 and a distal end 110B2. The third strip segment 110C has a proximal 110C1 and distal end 110C2. Finally, the fourth strip segment 110D has a proximal 110D1 and distal end 110D2.

The four strip segments 110A through 110D are adjacent to each other, with the exception of the first and fourth strip segments 110A and 110D, as shown on FIGS. 1A, 1B, and 2. With the exception of the first and fourth strip segments 110A and 110D, the previous strip segment's distal end is adjacent to the next strip segment's proximal end. In particular, the distal end 110A2 of the first strip segment 110A is adjacent to the proximal end 110B1 of the second strip segment 110B. The distal end 110B2 of the second strip segment 110B is adjacent to the proximal end 110C1 of the third strip segment 110C. Finally, the distal end 110C2 of the third strip segment 110C is adjacent to the proximal end 110D1 of the fourth strip segment 110D. For this purpose, the word "adjacent" is used to mean that the respective ends of the four strip segments 110A through 110D are joined as shown and described in the accompanying figures in such fashion that the first conductive layer 110 is one structure joined by four separate individual pieces bonded together, i.e. bonded segments, or in such fashion that the first conductive layer is simply four separate deposition strips, or one structure formed by integral segments. In either instance, and as shown in FIGS. 1A, 1B, and 2, the first through fourth strip segments 111A through 110D are consecutive segments that are perpendicular to their adjacent strip segments.

The first 110A and fourth 110D strip segments are not adjacent to each other, i.e. the distal end 110D2 of the fourth strip segment 110D is not adjacent to the proximal end 110A1 of the first strip segment 110A. However, it is evident from FIGS. 1A and 1B that a complete square outline is formed in the x-y plane when the second conductive layer 114 and its two microstrip extensions, i.e. first and second microstrip extensions 116A and 116B are included due to the second conductive layer and its first and second microstrip extensions forming a one-quarter of a square strip in the x-y plane.

The second 110B and third 110C strip segments are each one unit length in the x-y plane. The first 110A and fourth 110D strip segments are less than one unit length, with each being about one-half unit length. This geometry is what allows the combination of the second conductive layer 114 and microstrip extensions 116A and 116B to be about one-quarter of the square strip in the x-y plane. Stated another way, the microstrip extensions 116A and 116B spatially-extend in the x-y plane to form the complete square outline in the x-y plane with the proximal end 110A1 of the first strip segment 110A and the distal end 110D2 of the fourth strip segment 110D.

Figure 4A:
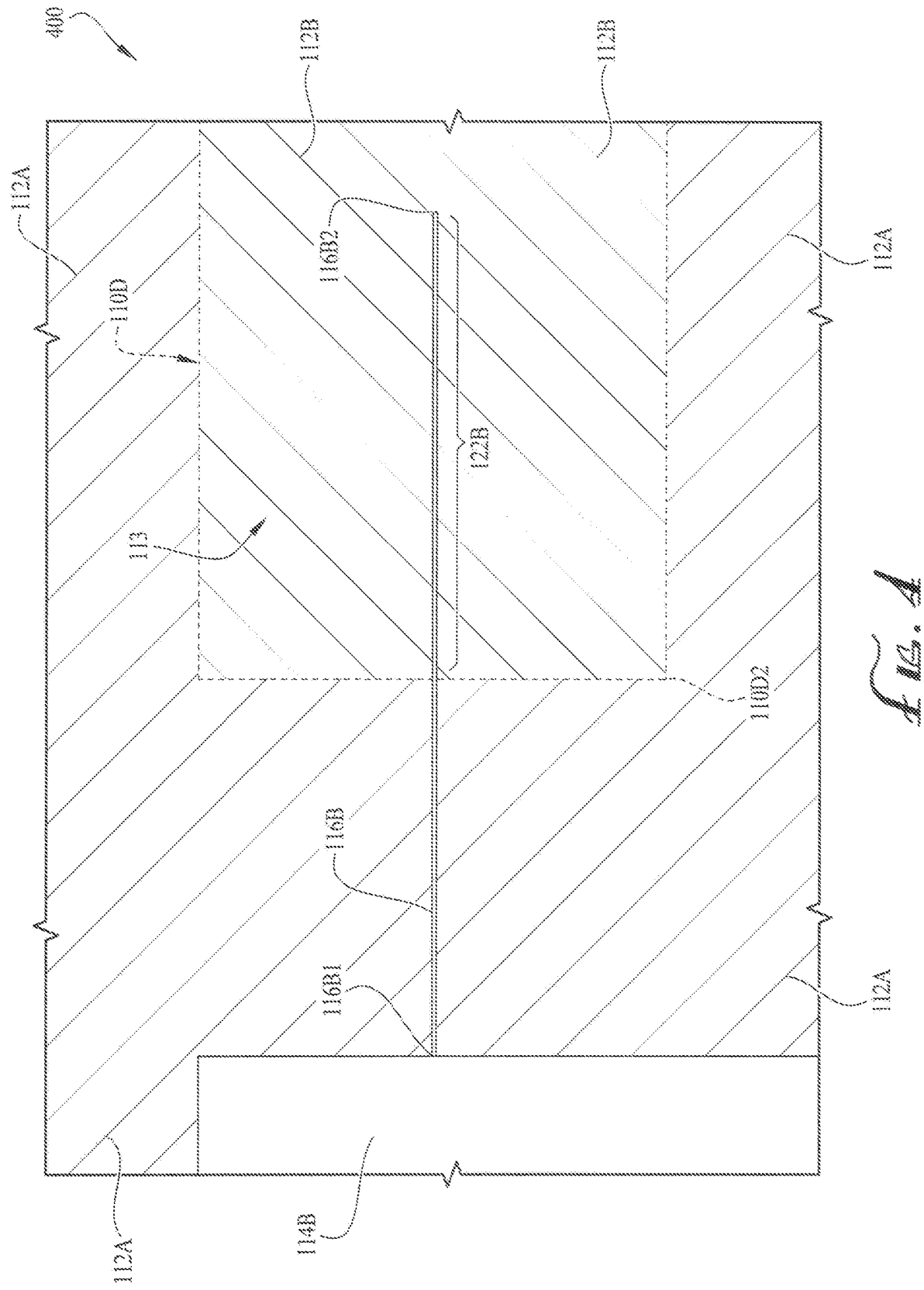
FIG. 4 illustrates a close-up view of a portion of the plan view of FIG. 1B, including a microstrip extension and overlap region, according to some embodiments.

Both the first and second microstrip extensions (116A and 116B) are shown in FIGS. 1A, 1B, and 2, and form first 122A and second 122B overlap regions with the first 110A and fourth 110D strip segments, respectively. FIG. 3A also shows the first overlap region 122A. FIG. 4 shows a close-up view, depicted by reference character 400, of the second microstrip extension 116B and second overlap region 122B. Additionally, the first and second conductive layers 110 and 114, respectively, as well as the dielectric layer 112 are depicted.

The first microstrip extension 116A has a proximal end 116A1 adjacent to the second conductive layer 110 and a distal end 116A2. For ease of viewing, the proximal end 116A1 of the first microstrip extension 116A is shown as the junction of the first microstrip extension with the second conductive layer 114. Similarly, the second microstrip extension 116B has a proximal end 116B1 adjacent to the second conductive layer 114 and a distal end 116B2. For ease of viewing, the proximal end 116B1 of the second microstrip extension 116B is also shown as the junction of the second microstrip extension with the second conductive layer 114.

The first microstrip extension 116A and its distal end 116A2 extends outwardly away from the second conductive layer 114, parallel to the x-axis 102 and the first strip segment 110A. It is evident in FIGS. 1A, 1B, and 3A that the first overlap region 122A is the length of the first microstrip extension 116A between the proximal end 110A1 of the first strip segment 110A and the distal end 116A2 of the first microstrip extension. The first overlap region 122A then extends parallel to the z-axis 106 from the first microstrip extension 116A through the dielectric layer 112 and through the thickness of the first conductive layer 110 and, specifically, the first strip segment 110A, and terminating at the first side of the first strip segment. One could also refer to the termination as occurring at the substrate 108.

The second microstrip extension 116B and its distal end 116B2 extend outwardly away from the second conductive layer 114, parallel to the y-axis 104 and the fourth strip segment 110D. It is very evident in the FIG. 4 close-up view that the second overlap region 122B is the length of the second microstrip extension 116B between the distal end 110D2 of the fourth strip segment 110D and the distal end 116B2 of the second microstrip extension. The second overlap region then extends parallel to the z-axis 106 from the second microstrip extension 116I through the dielectric layer 112 and through the thickness of the first conductive layer 110 and, specifically, the fourth strip segment 110D, and terminating at the first side 111 of the fourth strip segment. One could also refer to the termination as occurring at the substrate 108.

Thus, the first and second microstrip extensions (116A and 116B) form the first and second overlap regions 122A and 122B, respectively, by overlapping in the x-y plane, which is sometimes referred to as "spatially-overlapping," with respective ends of the first 110A and fourth 110D strip segments, as noted above. The overlap regions 122A and 122B are the regions where electron tunneling occurs, which allows electrons to pass to and fro between the microstrip extensions 116A and 116B and first conductive layer 110, through the dielectric layer 112. In this respect, the electron tunneling is from the second conductive layer 114 and, specifically, the first and second microstrip extensions 116A and 116B and through the dielectric layer 112 and then into the first conductive layer 110.

Therefore, the microstrip extensions 116A and 116B can also be referred to as electron tunneling inducement microstrip extensions and similar terminology. Electron tunneling is shown in FIG. 3A as a squiggly line 302 and sometimes designated by as "e." As shown in FIG. 3A, electron tunneling 302 occurs in the first microstrip extension 116A in the first overlap region 122A vertically down the thickness of the second conductive layer 114 and, especially, the first microstrip extension, in the z-axis 106 direction and into and through the entire thickness of the dielectric layer 112, but especially the entire thickness of the first portion 112A of the dielectric layer. The electron tunneling 302, also shown in FIG. 3A, continues into the first conductive layer 110, and especially the first strip segment 110A, and then vertically down the thickness of first strip segment of the first conductive layer, and terminating at the substrate layer 108. It is evident when viewing FIG. 3B that the first overlap region 122A would also be viewable. However, for ease of viewing, FIG. 31B does not show the first overlap region 122A in order to focus on the conformal nature of the dielectric layer 112. As such, discussion regarding the first 122A and second 122B overlap regions and electron tunneling 302 in FIG. 3A is also applicable to FIG. 3B.

Generally Applicable to all Embodiments

Although thicknesses of various layers are given, they represent only one of several thickness examples. Additionally, lengths of some components are given but, again, they represent only one of several examples. As such, a person having ordinary skill in the art will recognize that other thicknesses and lengths can be used depending on application-specific conditions without detracting from the merits or generalities of the embodiments. The substrate 108 is glass or fused silica. The first conductive layer 110 and second conductive layer 114 are Tungsten layers, with each layer having a 300 nanometers thickness. Each of the four strip segments 110A through 11D have a width in the x-y plane of one millimeter. The first and second portions 112A and 112B of the dielectric layer 112 are the same thickness, as measured in the z-direction. The thickness of the first portion 112A and the second portion 112B have the same thickness. Based on application-specific conditions, the thicknesses of the first portion 112A and second portion 112B of the dielectric layer is a range of 25 nanometers to 500 nanometers. The second conductive layer 114 is a ten centimeters by ten centimeters square. However, as with the other components, the second conductive layer 114 can be differently-dimensioned depending on application-specific conditions. The polymer used for the dielectric layer 112 is a negative photoresist polymer.

The first through fourth strip segments 110A through 110D are dimensioned based on application-specific conditions. For test platforms herein, the second 110B and third 110C strip segments are 23 millimeters in length. The first 110A and fourth 110D strip segments are about half the length of the second 110B and third 110C strip segments, thus 11 to 12 millimeters in length.

Each microstrip extension, i.e. the first and second microstrip extensions 116A and 116B create a one millimeter overlap between the second conductive layer 114 and the first conductive layer 110. Additionally, the first and second microstrip extensions 116A and 116B are much thinner than the first through fourth strip segments 110A through 114D. both the first and second microstrip extensions 116A and 116B have a width of five micrometers.

The first and second microstrip extensions 116A and 116B are Tungsten having the same thickness (300 nanometers) as the thickness of the first and second conductive layers 110 and 114 in the embodiments. The respective layers–first conductive layer 110, dielectric layer 112, and second conductive layer 114—are substantially-flat thin films. As configured herein, each unit cell, i.e. RF witness film 100 is a capacitive structure. The intimate adjacent contact discussed earlier is by deposition techniques. In particular, sputter deposition and spin coating was used to construct the RF witness film 100 and array 601 embodiments. Moreover, the embodiments employed RF sputtering where the sign of the anode-cathode bias is varied at a high rate, such as in excess of 13 MHz.

The embodiments are constructed using two sputtering deposition phases and spin coating. Patterning using traditional photolithography methods was also used. In particular, the first conductive layer 110 was overlain over the substrate 108 using sputter deposition. The exact locations and shape of the four strip segments 110A through 110D forming the first conductive layer 110 was achieved by using photolithography patterning. The dielectric layer 112 was applied by spin coating. Thus, the first portion 112A of the dielectric 112 was applied by spin coating over the portion of the substrate 108 that is not covered by the four strip segments 110A through 110D. The second portion 112B of the dielectric 112 was also applied by spin coating over the four strip segments 110A through 110D. Finally, the second conductive layer 114 was applied over the dielectric layer 112 using sputter deposition. Photolithography patterning was used to form the shape of the second conductive layer 114 and the first 116A and second 116B microstrip extensions. For purposes herein, both the first 116A and second 116B microstrip extensions can be considered either separate from or integral with the second conductive layer 114. One having ordinary skill in the art will recognize that the various structural features can be constructed using other depositional methods than those mentioned without detracting from the merits or generalities of the embodiments.

It is evident when viewing FIG. 3B, which is a very close-up view, that the dielectric layer 112 is not a perfectly flat layer, however it is substantially-flat, especially considering that the view is at the nanometers level. In FIG. 3B, the dielectric layer 112 is curved and resembles a sigmoid or sigmoidal-shape. Hence, the dielectric 112 can also be referred to as a sigmoidal-shaped dielectric or a conformal dielectric layer or sigmoidal-shaped conformal dielectric layer. The reason for this is that the dielectric 112 is continuous and conforms to underlying surfaces because it is deposited as a liquid and flows to conform to those underlying layers during spin coating and then dries, hence the reason for an offset and what appears to be a non-uniform surface. In particular, the dielectric 112 conforms to the surfaces of the substrate 108 and first conductive layer 110 and, as shown in FIG. 3B, the sigmoid-shape occurs where the first portion 112A of the dielectric 112 transitions to the second portion 112B of the dielectric. The region where the first portion 112A transitions to the second portion 112B is referred to as a transition zone 112C where the dielectric layer 112 has a step jump to smoothly transition to the second portion. The first microstrip extension 116A smooth transitions from the second conductive layer 114 at the transition zone 112C. The dielectric 112 has a first side 115 and a second side 117. Thickness of the dielectric 112 is taken transverse, i.e. perpendicular to the first 115 and second 117 sides and remains substantially-constant and remains the same throughout, irrespective of whether it is the first portion 112A or the second portion 112B of the dielectric.

The RF witness film structures and array (100 and 601) can be individually addressed sensors that are wired, much like a printed circuit board, especially in the array 601 and system under test 600 embodiments. A person having ordinary skill in the art will recognize how the wiring is configured and, as such, wiring of each unit cell 100 in the array 601 is not show for ease of viewing.

Theory of Operation and Working Test Platform

The RF witness film 100 was conceived and physically-fabricated, i.e. constructed, to capture incident electromagnetic radiation, and localize the electric field from that radiation into an ultrathin capacitive structure. FIGS. 1A and 1B show a single unit cell that is expanded in the x—102 and y—104 directions. Thus, the RF witness film 100, sometimes referred to as a unit cell and other variations, as noted earlier, can also be referred to as an ultrathin capacitive structure.

The dielectric 112 thickness is sometimes referred to as a vertical gap, or gap for short, between the first and second conductive layers 110 and 114 and is used in place of a traditional in-plane gap to give fine control of gap separation. Electrical leads, generically shown in some figures for ease of viewing, were used to apply a DC offset voltage for electrical testing and to apply a DC offset voltage 118 to improve sensitivity of the RF witness film 100. The first conductive layer 110 and the second conductive layer 114, in conjunction with the first and second microstrip extensions 116A and 116B, form the capacitive structures. Since each unit cell, i.e. each RF witness film 100 is a capacitive structure, it is known where the capacitor is in the embodiments. The inductance can be equated to current through a wire creating a magnetic field. The longer path lengths essentially function as an inductor. Therefore, a person having ordinary skill in the art will understand that this is especially the case at the first and second overlap regions 122A and 122B due to the electron tunneling 302 described earlier.

Figure 5:
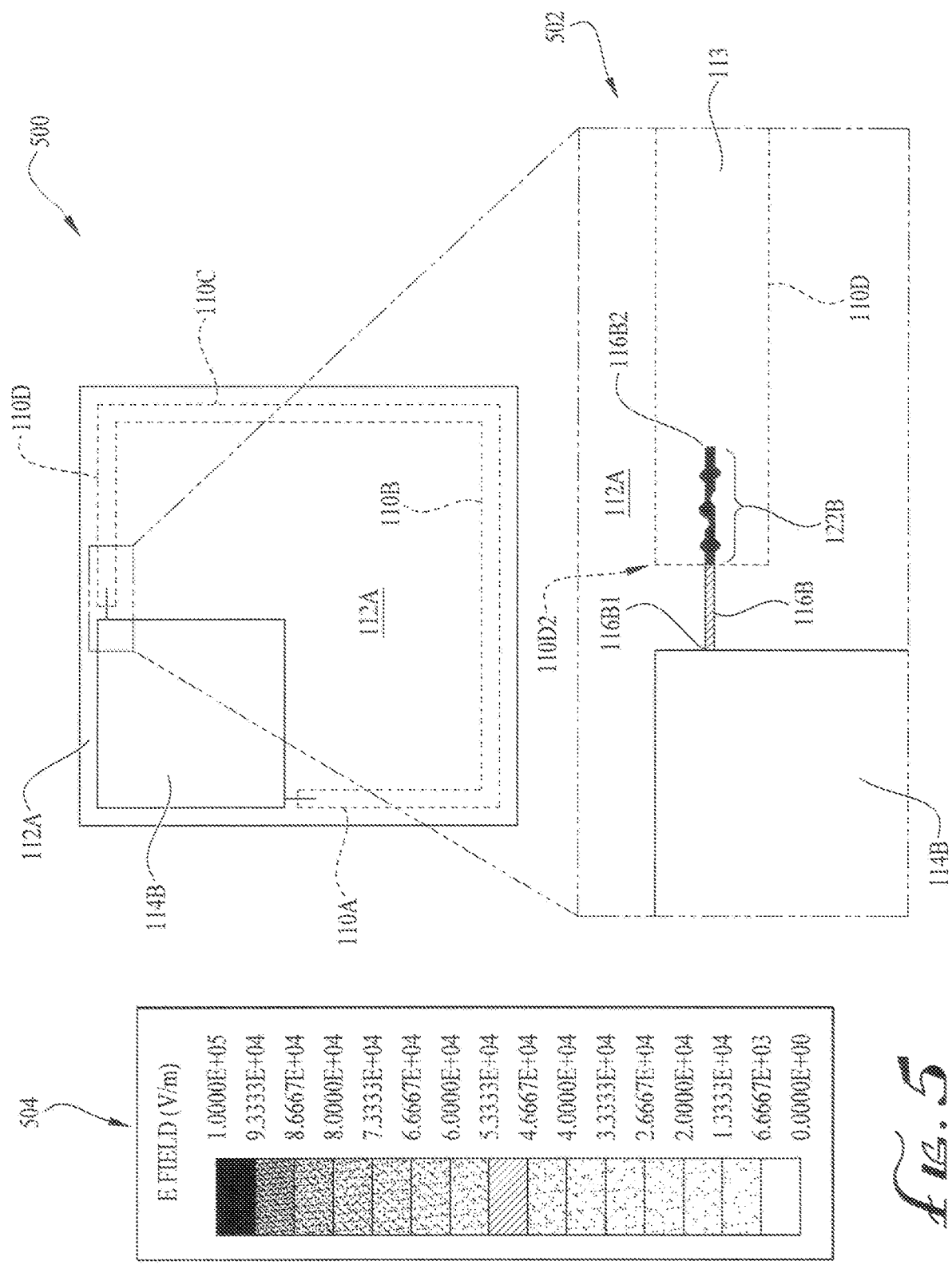
FIG. 5 illustrates a simulated electric field distribution in the RF witness film in FIG. 1B.

FIG. 5 shows a simulated electric field distribution 500 on both the first and second conductive layers 110 and 114 in the unit cell 100 in FIG. 1B. A close-up view 502 showing a portion of the second conductive layer 114, fourth strip segment 110D of the first conductive layer 110, and second microstrip extension 116B is shown. In particular, the close-up view 502 shows the second overlap region 122B, the region where the greatest electric field distribution occurs. The electric field distribution in volts per meter is graphically shown in the chart 504 on the left of FIG. 5. The electric field enhancements were greater than 11,000 in the simulations at ultrahigh frequency (UHF) RF radiation between 0.5 GHz and 2.0 GHz, and a dielectric layer 112 thickness of 0.2 micrometers. In particular, it is evident that the greatest electric field distribution occurs at the second overlap region 122B due to electron tunneling 302. The electron tunneling 302 causes the concentration of the electric field distribution to be the highest at the second overlap region 122B from the second microstrip extension 116B and underneath and down to the first conductive layer 110. A person having ordinary skill in the art will describe this as fringing fields from the second microstrip 116B down and through the dielectric layer 112 and into the first conductive layer 110.

The relationship between capacitance and frequency for an inductor-capacitor (LC) resonator is described in Equation No. 1.

$$\text{Frequency}_{LC\,resonator} \propto \frac{1}{\sqrt{(LC)}}, \quad \text{(Equation No. 1)}$$

where L=Inductance; and

C=Capacitance.

As the capacitance in the LC resonator increased, the resonant frequency dropped. This caused an increase in capacitance as the dielectric layer 112 thickness got smaller. The capacitance dependence on dielectric layer 112 thickness, i.e. gap size. Capacitance dependence is designated as $C_{Microstrip}$ for the microstrip configuration, is given in Equation 2.

$$C_{Microstrip} = \quad \text{(Equation No. 2)}$$

-continued
$$\sum_{\substack{n=1\\odd}}^{\infty} \frac{L}{(n\pi)^2 W \varepsilon_0 \left[\sinh\left(\frac{n\pi d}{b}\right) + \varepsilon_r \cosh\left(\frac{n\pi d}{b}\right)\right]},$$

where d=dielectric layer 112 thickness;
  $\varepsilon_r$=Dielectric Constant of Dielectric Layer (112), assumed to be 4;
  $\varepsilon$=Permittivity of Free Space=$8.854 \times 10^{-12}$ Farads per meter;
  A=area;
  W=microstrip width;
  L=length of microstrip; and
  b=width first conductive layer 110.

Both the first and second overlap regions 122A and 122B were one millimeter. The first conductive layer 110 had a width of one millimeter. The first and second microstrip extensions 116A and 116B had a width, i.e. diameter, of five micrometers. The frequency shift was small for the unit cell 100 between the dielectric layer 112 thicknesses of 25 nanometers to 500 nanometers.

Although not shown in FIG. 5, the same conditions and results are expected at the first overlap region 122A. Additionally, the incident radiation built up charge on opposing sides of the capacitive gap (the dielectric layer 112), i.e. on both the first and second conductive layers 110 and 114. The opposing charge created a potential difference that drove electron tunneling across the dielectric layer 112.

Figure 6:
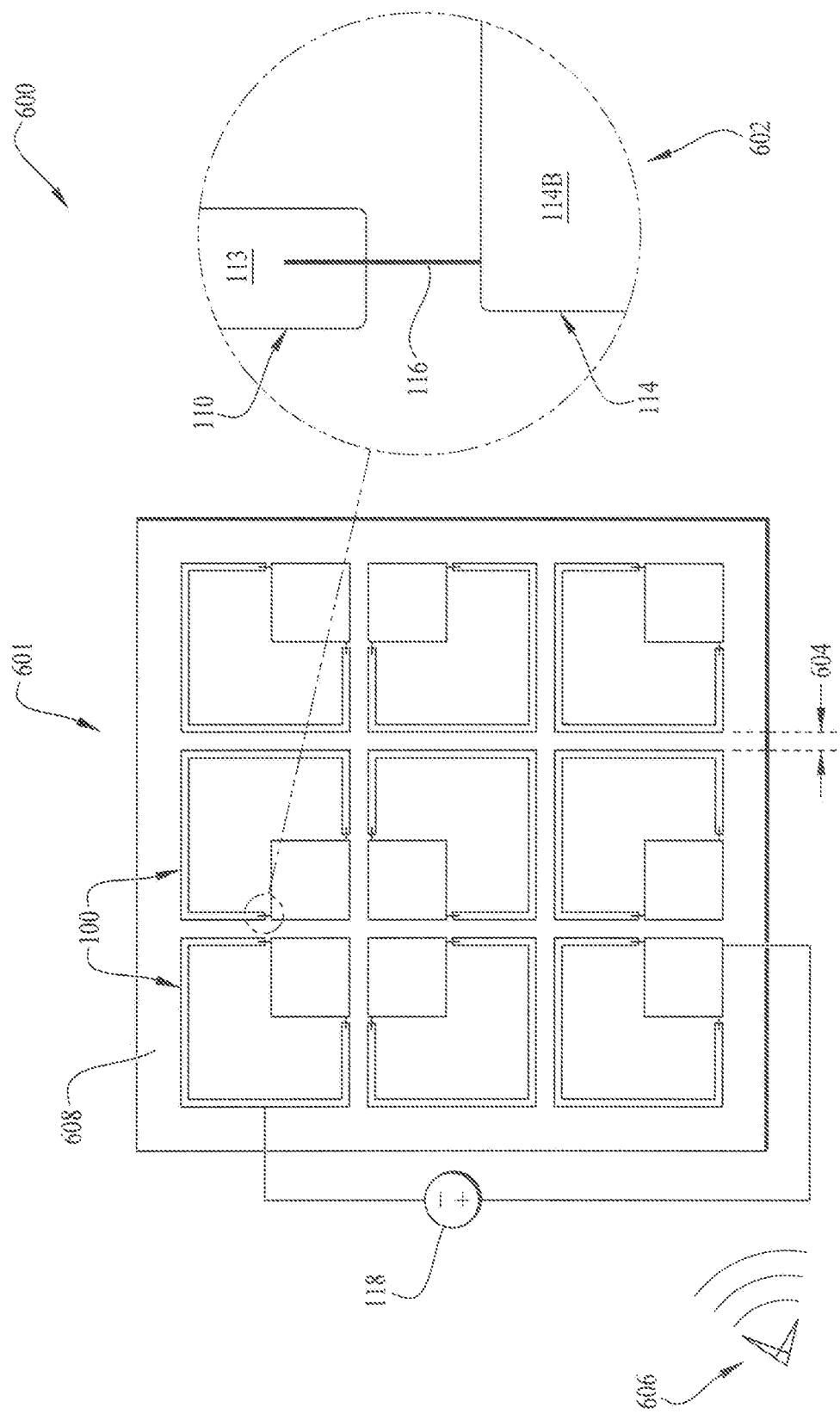
FIG. 6 illustrates a plan view of a system under test, including a constructed test array of RF witness films, according to some embodiments.

FIG. 6 illustrates a plan view of a system under test 600, including a constructed test array 601 of RF witness films 100. Notably, FIG. 6 is a working test system 600 and can also be referred to as a working test platform or system under test or simply system for short. The system under test 600, including the array 601 was fabricated in a solid state laboratory. The array 601 and each of the RF witness films 100 are constructed as shown and described in FIGS. 1A through 3B. Thus, unless stated otherwise with additional specificity, the embodiment shown in FIG. 6 is based on the preceding embodiments from FIGS. 1A and 1B. Deposition techniques for each individual RF witness film 100 in the array 601 were similar to those previously described.

The array 601 is in intimate adjacent contact with a substrate foundation 608. Additional substrate foundation 608 border is included on the outside edges of the array 601 to provide for stability during layer deposition and also additional structural rigidity necessary in a testing environment. The array 601 has a plurality of radio frequency (RF) witness films 100 overlain on the substrate foundation 608. Each of the RF witness films 100 is constructed as previously described. Each RF witness film 100 in the array, i.e. the plurality of RF witness films, is equally-spaced from adjacent RF witness films.

Each RF witness film 100 is configured to receive a direct current (DC) offset voltage 118 between the first conductive layer 110 and the second conductive layer 114. This provides a constant DC voltage for sensitivity adjustment of each RF witness film 100 in the array 601. For ease of viewing, only a single exaggerated electrical connection is shown for the DC offset voltage 118. It is understood that each RF witness film 100 in the array 601 is electrically-connected to the DC offset voltage 118. Specifically, it is understood that each first 110 and second 114 conductive layer in each RF witness film 100 is electrically-connected by wire to the DC offset voltage 118.

Figure 9:
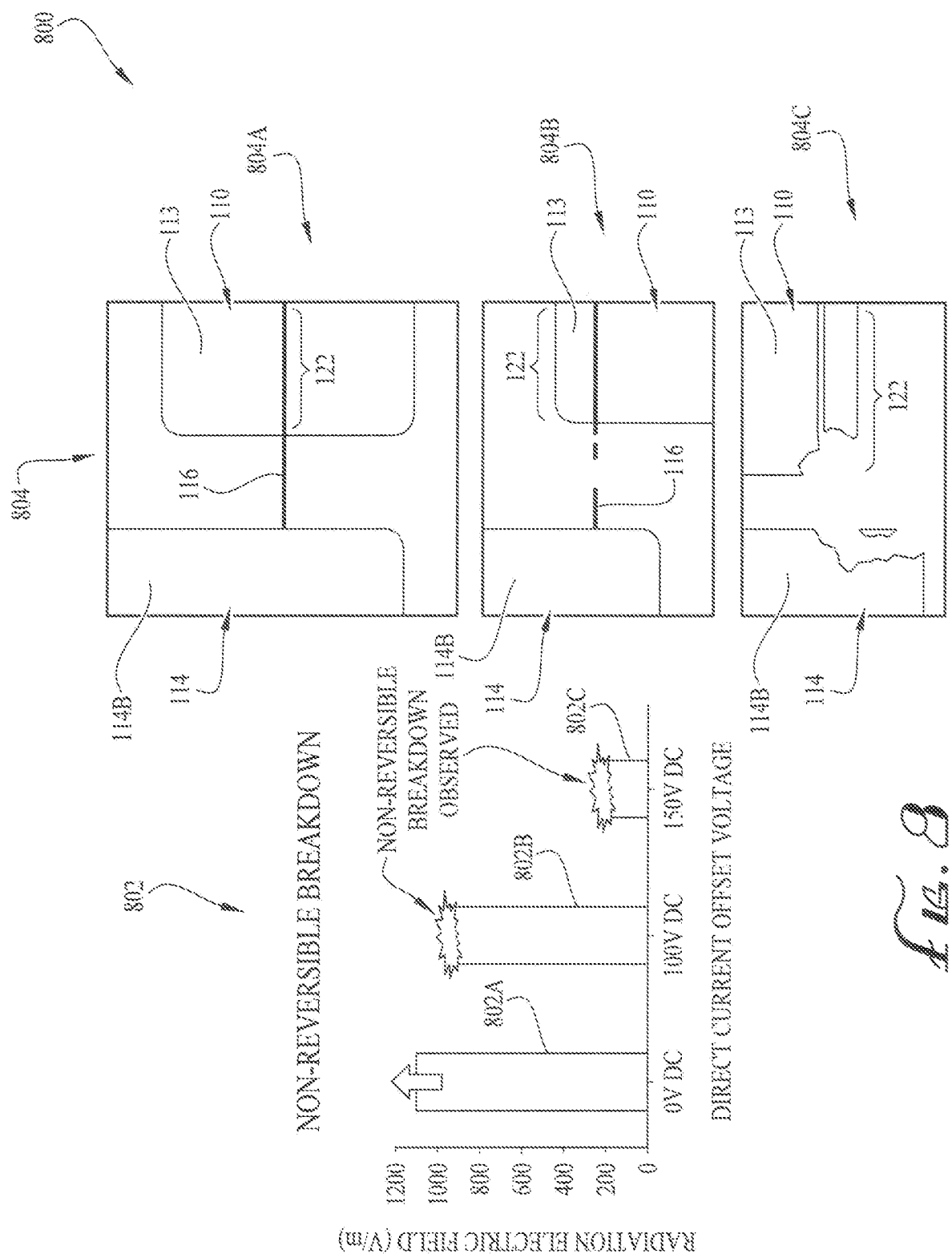
FIGS. 9A and 9B illustrate graphical depictions of frequency vs. electric field distribution for a metal plate test apparatus having a window aperture.

The system 600 was assembled for simulation and experimentation purposes. In particular, the system under test 600, was configured to recognize that a directed energy attack occurred, i.e. some form of radio frequency signals were propagated at the array 601. A person having ordinary skill in the art will understand that specific nomenclature for exactly which components are depicted, i.e. first of this or second of that, is based on orientation in the three-dimensional coordinate frame of reference. Therefore, in a close-up views 602, based on an optical microscope image, a single microstrip extension 116 is shown instead of determining whether the view depicts the first 116A or second 116B microstrip extension. The same applies with respect to both the first 110A and fourth 110D strip segments of the first conductive layer 110, which therefore is simply referred to as the "strip segment" and similar, such as "the strip segment of the first conductive layer." Additionally, the first conductive layer 110 is not shown with hidden lines and the dielectric layer 112 is not referenced in FIG. 6, even though it is understood to exist as in previous figures. These adaptations are for ease of viewing both FIG. 6 as a whole, including both the close-view 602 and in further discussion with respect to FIG. 9.

The array 601 is a three by three element array, i.e. nine unit cells 100. It is evident that a nearest neighbor gap distance 604 is consistently applied between each of the unit cells 100 in the array 601. A one millimeter space is maintained between metal constituents and the unit cell 100 boundary, i.e. the edge of an individual substrate 108, such as with an individual. unit cell 100. This is maintained in the array 601, which allows for the nearest neighbor gap distance 604 to be two millimeters in the array in FIG. 6. The array 601 is polarization insensitive so that its orientation does not matter and can be turned and still yield the same results. The array 601 was optimized to enhance electric field incident on the array inside of the dielectric layer 112. Physically, the array 601 in FIG. 6, including the substrate foundation 608 shown is a four inch square in the x—102 and y—104 directions. The array 601 is a three dimensional configuration having an array period of 25 millimeters. It is understood that other size arrays 601, nearest neighbor gap distances 604, substrate foundations 608, and array periods can be employed based on application-specific conditions without detracting from the merits or generalities of the embodiments.

A high gain antenna 606, sometimes referred to as an antenna and, in particular, a horn antenna, was included in the system 600 to propagate RF signals at the array 601. The horn antenna 606 in FIG. 6 replicates a threat antenna. As such, the antenna 606 is often referred to as a threat antenna herein. A person having ordinary skill in the art will recognize that input power is provided to the antenna 606 and, for ease of viewing, is not shown in FIG. 6.

The DC offset voltage 118 heats the RF witness films to increase their sensitivity. The threat antenna 606 in FIG. 6 emulates a directed energy attack on the array 601 by radiating radio frequency signals in a range of 100 volts per meter to 450 volts per meter of electromagnetic radiation at the array. The threat antenna 606 imparts electromagnetic radiation (RF signals) at the array 601, which provides induces significant heat at the array 601, which is sometimes referred as a "resistive heating." The resistive heating is the effect of high intensity radiation from the threat antenna 606 that is imparted to the array 601. The DC offset voltage 118 is varied to change the sensitivity of the RF witness films 100 as a way to adjust to the antenna's imparted electromagnetic radiation intensity. It should be noted that the heat provided by the DC offset voltage 118 is much lower than the resistive heating from the threat antenna 606. Adjusting the DC offset voltage 118 allows the array the individual RF witness films 100 in the array 601 to sense the electromagnetic energy intensity from the threat antenna 606.

For ease of viewing, FIG. 6 only shows a single electrical connection between the DC offset voltage 118 and the array 601. However, it is understood that each RF witness cell 100 in the array 601 is electrically-connected to the DC offset voltage 118 as shown in FIG. 1B. This allowed the DC offset voltage 118 to be applied between the first 110 and second 114 conductive layers of each RF witness cell 100 in the array 601. This allowed the current to be measured which flowed between the first 110 and second 114 conductive layers. When no electromagnetic radiation was incident on the array 601, no current was observed. The current was then monitored with varying DC offset voltages 118 and electric field strengths of narrowband continuous wave electromagnetic radiation through the frequency range of 0.9 GHz to 1.8 GHz.

FIG. 7, depicted by reference character 700, shows the resulting tunneling current (y-axis) as a function of incident radiation frequency and field strength (x-axis) for the system under test 600 in FIG. 6 at a 100 volts per meter DC offset voltage during current data collection. FIG. 7 gives evidence of the reversible breakdown of the dielectric layer 112. The data was collected with a 100V DC offset voltage (reference character 118) and with the threat antenna 606 radiating a range of electromagnetic radiation at the array 601. Curves are shown in FIG. 7 for electromagnetic radiation from the threat antenna 606 at 100 volts per meter DC, 150 volts per meter DC, 200 volts per meter DC, 300 volts per meter DC, and 450 volts per meter DC, with the stand-off distance between the antenna 606 and the array 601 equal to one foot. The tunneling current was observed for frequencies at the low frequency edge of the observed resonance, which was attributed to strongest electric field enhancement at that frequency. At higher incident radiation electric field strength, the RF witness cells 100 in the array 601 experienced non-reversible breakdown. Additionally, the frequency of incident radiation capable of exciting tunneling current red shifted. The existence of tunneling current was evidence of the proposed mechanism, and the shift was confirmation of the absorption feature frequency shifting expected as the electron tunneling increased.

FIG. 8, depicted with reference character 800, shows close-up views, depicted by reference character of non-reversible breakdown in the system under test 600 from FIG. 6 and the incident electric field threshold for breakdown. In particular, the first and second conductive layers 110 and 114, as well as the first and second microstrip extensions 116A and 116B are aluminum to visibly demonstrate electron tunneling results. As shown on the left hand side of FIG. 8 by reference character 802, the DC offset 118 can be varied to change the sensitivity of the RF witness films 100 as an adjustment to the threat antenna 606 intensity. Three close-up views 804 on the right-hand side are originally from a microscope corresponding to the various DC offset voltages on the left hand side with reference character 802. Specifically, the three close-up views 804 are broken down with reference characters 804A, 804B, and 804C, and show varying stages of breakdown.

FIG. 8 simplifies components shown in the close-up views 802A, 802B, and 802C on the right hand side 804 for ease of viewing. The close-up views 802A, 802B, and 802C use similar nomenclature and simplified depictions of components for ease of viewing. Additionally, for the same reason, this also applies to the first 122A and second 122B overlap regions, which is generically shown as an overlap region 122. Additionally, the first conductive layer 110 is not shown with hidden lines and the dielectric layer 112 is not referenced in FIG. 8 to maintain consistency with FIG. 6 and to appropriately show the effects of conditions before and after breakdown.

Reference characters 802A and 804A depict the conditions before breakdown at 0 V DC offset voltage at the strip segment of the first conductive layer 110 and the second conductive layer 114, respectively. It is also evident that the microstrip extension 116 is visible and remains intact. Additionally, the overlap region 122 is visible. There are no physical changes noted in the 0 V (zero volts) DC offset voltage environment 804A.

Reference characters 802B and 804B depict the conditions at 100 V DC offset voltage, which results in non-reversible breakdown. Reference character 804B shows the second conductive layer 114 and the strip segment of the first conductive layer 110. The microstrip extension 116 is visible. It is evident that physical changes are present, especially in the microstrip extension 116, which is now in at least two pieces. Additionally, a portion of the microstrip extension 116 and possibly a portion of the strip segment of the first conductive layer 110 in the overlap region 122 may also be damaged.

Finally, reference characters 802C and 804C depict the conditions at 150V DC offset voltage, which also results in non-reversible breakdown. It is apparent that physical changes in the components are extreme here. Reference character 804C shows the second conductive layer 114 and the strip segment of the first conductive layer 110. The microstrip extension 116 appears to be completely destroyed in this view. Additionally, significant portions of the strip segment of the first conductive layer 110 are also missing due to the non-reversible breakdown. It appears significant portions of the overlap region 122 in the strip segment of the first conductive layer 110 are missing. For instance, a corner of the strip segment in the first conductive layer 110 appears to have a bite taken out of it. Likewise, it appears that there is damage to the strip segment in the first conductive layer 110, especially in the interior portion of it that would be directly below the microstrip extension 116 if the microstrip extension was still present. Finally, it is noticeable that the second conductive layer 114 is also damaged as if it also has had a bite taken out of it.

Thus, the non-reversible breakdown was marked by physical changes in the RF witness film 100 structure. The use of aluminum metal in the first and second conductive layers 110 and 114, respectively resulted in removal of material in the respective overlap regions. This is perfectly acceptable because FIG. 6 is a test system 600 and nicely illustrates the effects of the resistive breakdown in softer metals, such as aluminum. Thus, if something occurs, such as a directed energy impulse and it is evidenced by the RF witness film 100 or the entire array 601, then it allows a person having ordinary skill in the art to deduce that the occurrence happened at a particular frequency and power level. Notably, it is also possible to use a more refractory metal and evidence the non-reversible breakdown with a permanent defect being imprinted into the dielectric layer 112.

The electric field threshold for non-reversible breakdown (802B and 802C) was influenced by the offset voltage applied to the RF witness film 100. With no DC offset voltage 802A, non-reversible breakdown could not be achieved with the maximum 1100 V/m field strength possible with the system 600 used to test the array 601. With 100 V DC offset voltage 802B the breakdown occurred at 940 V/m electric field strength. Finally, with 150 V DC offset voltage 802C the RF witness film 100 suffered a non-reversible breakdown at 200 V/m electric field strength.

Observations and Phenomenon in Working Platforms

At incident electric field strengths greater than 150 volts per meter, the RF witness film 100 generated enough electric potential that electron tunneling current was observed. The maximum values of the absorptance occurred between 0.7-1 GHz. The dependence on frequency, rather than dielectric layer 112 thickness, was attributed to effective wavelength matching the periodicity in the array 601. Varying the array period allowed resonant frequency tuning. Periodicity is a function of the nearest neighbor gap distance 604. Increases in the nearest neighbor gap distance 604 result in an increase in the periodicity and a decrease in capacitance. Conversely, decreases in the nearest neighbor gap distance 604 result in a decrease in the periodicity and an increase in capacitance. The changes in capacitance results in corresponding changes in frequency. Maximum absorptance of 0.42 with a 500 nanometers dielectric layer 112 thickness was observed.

The amount of tunneling current was driven by the electric field strength of the incident radiation. The electron tunneling shifted the resonant frequency and created a loss mechanism due to heating observed at the electron tunneling locations. The conversion of photons to tunneling electrons was nonlinear with respect to incident radiation field strength. The nonlinear thermal loss ramped up with incident radiation field strength to limit the RF transmission, but the frequency shift could also be used to limit transmission. The transmission band of the tunable structure could be placed in series with a static narrow band transmission filter such that transmission bands of the static and tunable filters aligned when the incident radiation had a low incident radiation field strength. At high incident radiation field strength, the tunable structure shifted the frequency of the transmission band such that it did not spectrally align with the static narrow band transmission filter. This spectral misalignment between the static and high intensity radiated tunable structure also prevents transmission when the tunable structure was in series with a static filter. The use of a series configuration of a tunable and static filter was called a double filter shutter.

HPRF signals, sometimes referred to as HPRF pulses, may have ultra-fast electric field rise times, in the sub picosecond range. These fast rise times allow unplanned HPRF interference to defeat traditional electromagnetic shutters because the shutters respond too slow to prevent electronic damage. The switch time for the double filter shutter described herein can be determined by the tunneling time for electrons in the first and second overlap regions 122A and 122B.

The limiting nature of the embodiments was due to two phenomena occurring when electron tunneling was present in the RF witness films 100. The first phenomenon was the shifting of resonant frequency as the RF witness films 100 began to experience leakage current. That shift, which was evidenced in the tunneling current data in FIG. 8, allowed for the transmission reduction via passband mismatch with a series static narrow band filter. A potential mechanism to use frequency shifting is given below assuming a system with two filters in series, referred to as low and high conditions.

In the low condition, the electric field incident on double filter is static and the tunable filters' pass bands align spectrally. The double filter stack transmits energy like a traditional window. However, in the high condition, the electric field incident on the double filter causes tunable filter shifts such that the pass band does not align with the static filter pass band. The double filter stack blocks energy like a traditional shield.

The second phenomenon was the conversion of energy from radiation into heat. During the tests conducted, there was direct evidence of that heat generation. FIG. 8 shows material removal due to extreme heat. Multiple tests resulted in aluminum removal from the RF witness film 100.

The self-limiting nature of the metamaterial window was tested with an electric field probe stationed behind the metamaterial. This test required an additional test structure around the window to ensure the radiation was only able to reach the receiver by transmitting through the window. Two test apparatus were investigated to this end.

The first apparatus was a large metal plate test apparatus having a window aperture. A blank glass substrate was placed in the aperture. The frequency vs. electric field distribution response for this condition is graphically shown in FIG. 9A and depicted by reference character 900A. In another test using the same large metal plat test apparatus, a metamaterial window is placed in the apparatus. The frequency vs. electric field distribution response for this condition is graphically shown in FIG. 9B and depicted by reference character 900B.

Figure 10A:
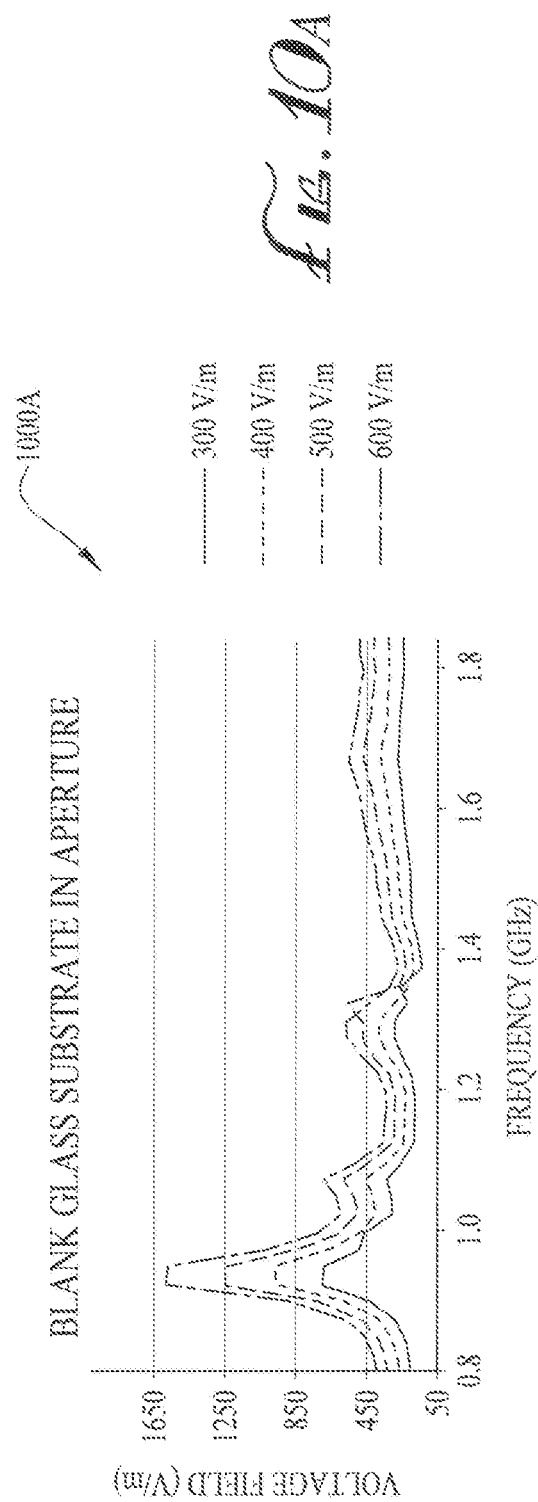
FIGS. 10A and 10B illustrate graphical depicts of frequency vs. electric field strength for a metal box test apparatus around an electric field sensor with a wall replaced with a window aperture.
Figure 10B:
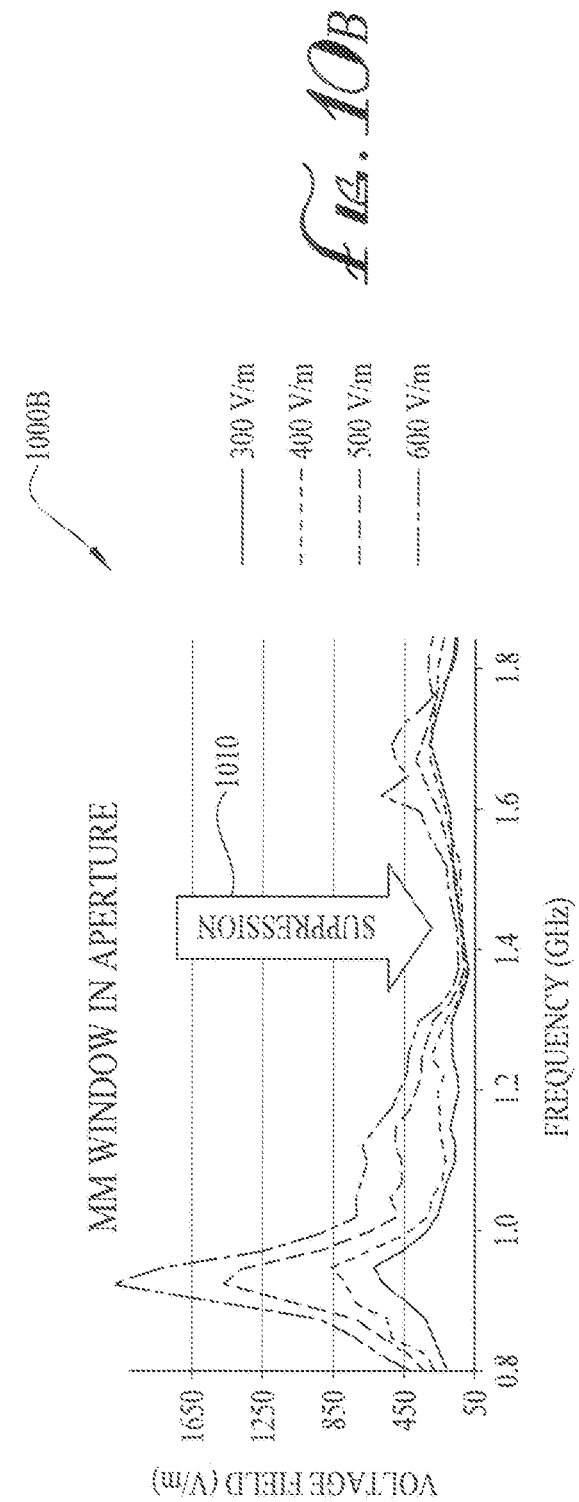

The second test apparatus was a metal box test apparatus around an electric field sensor with a wall replaced with a window aperture. FIG. 10A depicts the frequency vs. electric field strength response when a blank glass substrate is inserted into the aperture. FIG. 10B depicts the response with a metamaterial window in the aperture. The second test apparatus, the metal box, influenced the frequency of resonance and threshold for suppression, but both systems confirmed RF limiter character, as shown in FIGS. 9A through 10B, as discussed below.

Each metamaterial array was printed onto a fused silica substrate, i.e. on a metamaterial window in the aperture (FIGS. 9A and 10A). The metamaterial response as a function of incident electric field strength was compared to an identical study performed on the substrate alone, i.e. on a blank glass substrate in the aperture. In FIG. 9A, reference character 900A depicts data in the first test apparatus, i.e. the large metal plate with window with the blank glass substrate in the aperture. In FIG. 9B, reference character 900B depicts data for the same large metal plate with window with the fused silica substrate. In FIG. 10A, reference character 1000A depicts the data from the second test apparatus, i.e. the metal box, on the blank glass substrate. In FIG. 10B, reference character 1000B depicts the data for the same metal box with the fused silica substrate.

In both test apparatuses, the metamaterial window data, reference characters 900B and 1000B in FIGS. 9B and 10B, respectively, showed that low intensity radiation had very similar intensity of electric field transmitted compared to the substrate alone (900A and 1000A in FIGS. 9A and 10A, respectively). At larger electric field strengths, the metamaterial showed transmission suppression (910 in FIG. 9B for the metal plate and 1010 in FIG. 10B for the metal box) compared to the substrate. The electric field strengths captured by the sensor in the metallic box (FIGS. 10A and 10B) were much higher than those captured behind the metal plate apparatus (FIGS. 9A and 9B). This gain in the metallic box apparatus (FIGS. 10A and 10B) contributed to the observation of the transmission suppression at a lower electric field strength threshold of only 400 V/m. The metal plate apparatus (FIGS. 9A and 9B) generated less dispersion in the transmitted radiation, and gave a threshold of 600 V/m. In both cases, a narrow band RF transmittance suppression was observed with small frequency perturbation from the free space resonance frequency. The frequency shift was attributed to coupling between the test apparatus and the metamaterial surface. Based on this, it is clear that as the electric field strength (V/m) increases on the surface of the array, such as the array 601 in FIG. 6 and its associated RE witness films 100, suppression of the radiated energy at the resonant frequency occurs.

Figure 11:
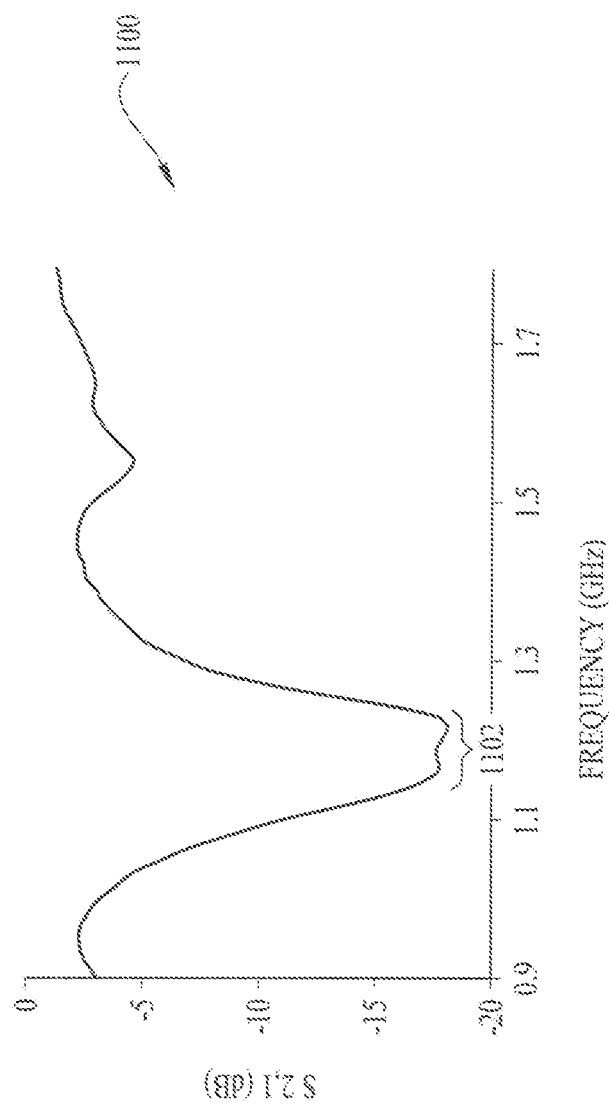
FIG. 11 illustrates a graphical depiction of scattering parameter data of the system under test in FIG. 6.

FIG. 11 is a graphical depiction 1100 of scattering parameter data of the array 601 in the system 600 shown in FIG. 6. The S2, 1 (dB) scattering parameter data is shown on the y-axis of the graph compared to the frequency (GHz) on the x-axis. The array 601 showed a dip 1102 in forward scattered radiation that occurred around 1.2 GHz. This indicates that a rejection band occurred at 1.2 GHz. The dip 1102 in S2,1 agreed with simulated scattering parameter predictions for the fundamental resonance frequency of the array 601.

Figure 12A:
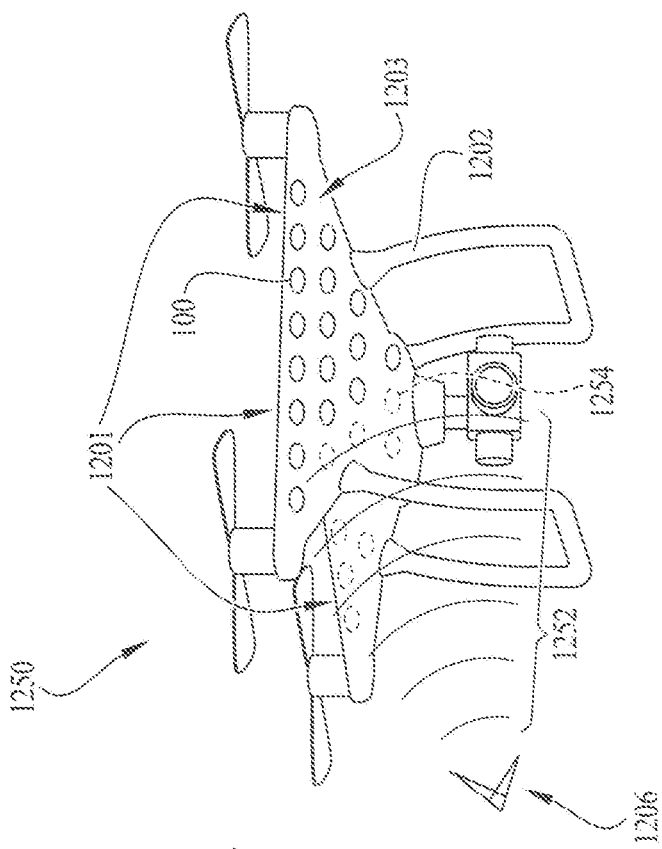
FIGS. 12A and 12B depict partial shielding operating environments, according to some embodiments.
Figure 12B:
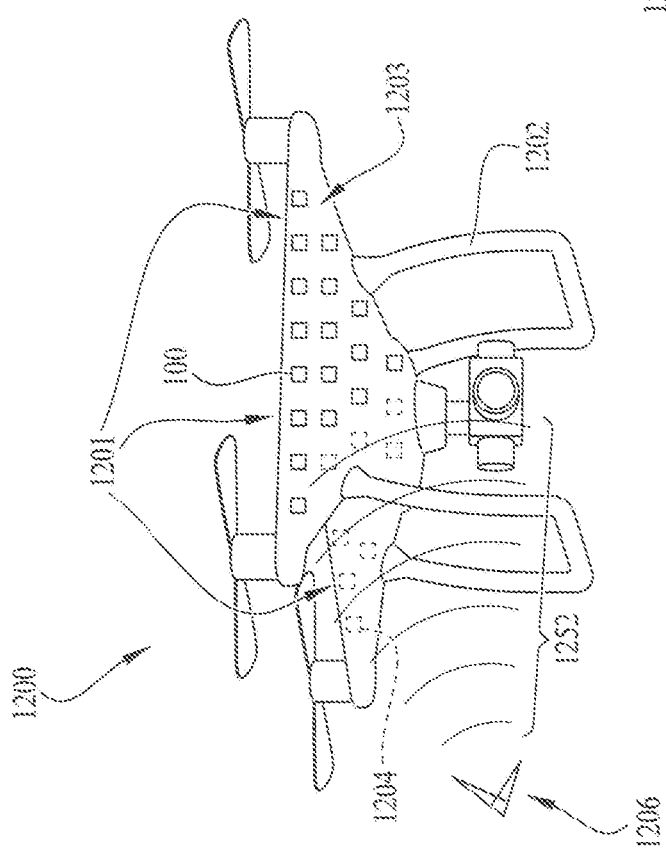

FIGS. 12A and 12B illustrates partial shielding operating environments 1200 and 1250, respectively. It is understood that the various embodiments can be used in many environments and FIGS. 12A and 12B shows only two of those environments. In both FIGS. 12A and 12B, an object 1202 is shown that can be protected by the disclosed features. The object 1202 can also be referred to as an asset without detracting from the merits or generalities of the embodiments. The object 1202 has an outer surface 1203. Electronics (not shown for ease of viewing) are housed inside the object 1202 and not seen because they are shielded from view by the outer surface 1203. The electronics are to be protected from electromagnetic energy, sometimes referred to as directed energy, directed electromagnetic energy, or high power radio frequency (HPRF) interference signals 1252 which could damage the electronics. The object 1202 illustrated is a drone, sometimes referred to as an unmanned aerial vehicle (UAV). The object 1202 can also be larger than a drone. Moreover, the embodiments are applicable to both manned and unmanned airborne platforms.

Notably, the embodiments can also protect other structures such as, for example, land, air, and sea vehicles. Additionally, stationary structures can also be protected such as computers, buildings, and radio detection and ranging (RADAR) structures. A person having ordinary skill in the art will recognize that only portions of the object 1202 need protection from the HPRF interference signals 1252, i.e. those portions housing electronics that could be adversely affected by the HPRF interference signals.

In particular, both the FIG. 12A and FIG. 12B operating environments, 1200 and 1250, respectively, a threat antenna 1206 is radiating the HPRF interference signals 1252 at the object 1202. The HPRF interference signals 1252 are a directed energy attack. The threat antenna 1206 shown is similar to that described earlier, such as in FIG. 6.

A thin film is applied to the object's outer surface 1203. The thin film is similar to the embodiments described earlier, and is constructed with a substrate foundation (similar to reference character 608 earlier) in intimate contact with the object's 1202 outer surface. An array 1201 is in intimate contact with the substrate foundation 608 due to its plurality of radio frequency (RF) witness films 100 being overlain on the substrate foundation 608. As discussed earlier, each RF witness film 100 is equally-spaced from adjacent RF witness films. A direct current (DC) offset voltage (118 in previous embodiments but not shown in FIGS. 12A and 12B for ease of viewing) is associated with the object 1202. Each RF witness film 100 in the plurality of RF witness films is electrically-connected to the DC offset voltage 118.

The RF witness films 100 can be powered by the object's internal power system and can be individually-addressed sensors that are wired, much like in a printed circuit board application. Additionally, individual RF witness films 100 and DC offset voltage 118 can be electrically-connected to and in signal communication with the object's power and computer systems, respectively. Both series and parallel connections are valid. The electrical and computer routes and structures, including the DC offset voltage 118, are not shown in FIG. 12A or 12B for ease of viewing and because a person having ordinary skill in the art will recognize that drone and airborne platform power and computer structures are well-known. The DC offset voltage 118 can be varied to change the sensitivity of the RF witness films 100 as a way to adjust to the antenna's imparted electromagnetic radiation intensity, i.e. as a way to adjust to the HPRF interference signals 1252 intensity.

The layered structures discussed earlier are included in the depicted array 1201. The array 1201 is applied to the object 1202 in an applique fashion, such as through a thin film adhesive. Examples can include, but are not limited to, thin film adhesive tapes that can be applied via a thin film, such as a thin film roll or thin film sheet, which are often referred to as a polyimide thin film sheet. The array 1201 is constructed of similar thin film materials as discussed before. In the embodiments shown in FIGS. 12A and 12B, the first and second conductive layer 110 and 114 and the first and second microstrip extensions 116A and 116B are Tungsten.

The entire array 1201 is conformal to the outer surface of the object 1202. This is possible because the entire thin film, i.e. substrate foundation 608, the array 1201 and its plurality of radio frequency (RF) witness films 100, is a thin film applique on the outer surface of the object which allows the array to wrap as needed to hug the object 1202 closely, conforming to the object's 1202 contours where applied, and maintain its location after application. This is possible because the entire structure of the thin film is flexible and deformable. Additionally, the thin film can be transparent. Thus, the array 1201 and its plurality of RF witness films 100 wrap around the body of the object 1202 to create a thin film shield, sometimes referred to as a barrier, protective barrier, or protective shield between the object and the HPRF interference signals 1252.

It is apparent in FIG. 12A that the RF witness films 100 are square in shape. Conversely, the RF witness films 100 in FIG. 12B are oval in shape. Other shapes are equally-valid without detracting from the merits or generalities of the embodiments. The array 1201 and its RF witness films 100 experience the HPRF interference signals 1252 at different times, some earlier than others, based on their distance from the threat antenna 606. FIGS. 12A and 12B show activated RF witness films 1204 and 1254, respectively, in the array 1201 that are being imparted with the HPRF interference signals 1252. The activated RF witness films 1204 and 1254 are turned on when they experience, i.e. receive or are hit by, the HPRF signals 1252. The activated RF witness films 1204 and 1254 then begin switching frequencies and suppressing the incident directed energy from the HPRF signals 1252, relying on electron tunneling in the activated RF witness films. It is understood by a person having ordinary skill in the art that the entire operating environment can change to a complete shielding environment after all RF witness films 100 experience the HPRF signals 1252, i.e. after all RF witness films are hit by the HPRF signals. This condition is not shown for ease of viewing because it would simply show all RF witness films 100 as being activated RF witness films 1204 and 1254, respectively.

Based on the information discussed herein, the embodiments can be tuned in at least three ways. The three ways are: 1) by varying the sensitivity of the RF witness films 100 by varying the DC offset voltage 118; 2) by varying the thickness of the dielectric layer 112, and; 3) by varying the array period which allows resonant frequency tuning.

While the embodiments have been described, disclosed, illustrated and shown in various terms of certain embodiments or modifications which it has presumed in practice, the scope is not intended to be, nor should it be deemed to be, limited thereby and such other modifications or embodiments as may be suggested by the teachings herein are particularly reserved especially as they fall within the breadth and scope of the claims here appended.

What is claimed is:

1. An object protection system, comprising:
   an object having an outer surface, said outer surface housing electronics;
   an antenna configured to radiate high power radio frequency (HPRF) interference signals at said object;
   a thin film applied to said outer surface, said thin film further comprising:
      a substrate foundation;
      an array in intimate adjacent contact with said substrate foundation, said array having a plurality of radio frequency (RF) witness films overlain on said substrate foundation;
      wherein each RF witness film in said plurality of RF witness films is equally-spaced from adjacent RF witness films; and
   a direct current (DC) offset voltage associated with said object, wherein each RF witness film in said plurality of RF witness films is electrically-connected to said DC offset voltage.

2. The system according to claim 1, wherein said antenna is a threat antenna.

3. The system according to claim 1, wherein said thin film is a flexible, deformable film.

4. The system according to claim 1, wherein said thin film is transparent.

5. The system according to claim 1, wherein said thin film is a flexible, transparent, deformable film.

6. The system according to claim 1, wherein said thin film is configured as a protective shield between said object and said HPRF interference signals.

7. The system according to claim 1, wherein each RF witness film in said plurality of RF witness films is a unit cell defined in a three-dimensional coordinate frame of reference defined by an x-axis, a y-axis, and a z-axis, said unit cell centered at an origin of said three-dimensional coordinate frame of reference, said unit cell, comprising:
   a first conductive layer in intimate adjacent contact with said substrate foundation;
   a dielectric layer having a first portion and a second portion, said first portion in intimate adjacent contact with said substrate foundation, said second portion in intimate adjacent contact with said first conductive layer; and
   a second conductive layer having a first side and a second side, said first side of said second conductive layer in intimate adjacent contact with said first portion of said dielectric layer;
   wherein said second conductive layer having at least two microstrip extensions perpendicular to each other in the x-y plane.

8. The system according to claim 7, wherein said DC offset voltage is electrically-connected between said first conductive layer and said second conductive layer, said DC offset voltage providing a constant DC voltage to each RF witness film in said plurality of RF witness films.

9. The system according to claim 7, further comprising:
   wherein said first conductive layer having first, second, third, and fourth strip segments joined end-to-end and forming three-quarters of a square strip outline in the x-y plane, wherein each of said first, second, third, and fourth strip segments having a first side and a second side, each of said first side of said first, second, third, and fourth strip segments in intimate adjacent contact with said substrate foundation;
   wherein said first portion is defined by an area interior to said first, second, third, and fourth strip segments in the x-y plane, and between said substrate foundation and said first side of said second conductive layer parallel to said z-axis;
   wherein said second portion of said dielectric layer is defined by an area delineated by, and in intimate adjacent contact with, each of said second sides of said first, second, third, and fourth strip segments in the x-y plane, and spanning parallel to said z-axis to the z-axis elevation of said first side of said second conductive layer.

10. The system according to claim 9, further comprising:
    wherein each of said first, second, third, and fourth strip segments having a proximal end and a distal end, said distal end of said first strip segment is adjacent to said proximal end of said second strip segment, said distal end of said second strip segment is adjacent to said proximal end of said third strip segment, said distal end of said third strip segment is adjacent to said proximal end of said fourth strip segment;
    wherein said first and fourth strip segments are not adjacent to each other;
    wherein said second conductive layer and said at least two microstrip extensions forming one-quarter of a square strip in the x-y plane, said three-quarters of a square strip outline and said one-quarter of a square strip forming a complete square strip outline in the x-y plane.

11. The system according to claim 10, further comprising:
    said first microstrip extension having a proximal end at said second conductive layer, and a distal end extending outwardly away from said second conductive layer parallel to said x-axis and said first strip segment;
    said second microstrip extension having a proximal end at said second conductive layer, and a distal end extending outwardly away from said second conductive layer parallel to said y-axis and said fourth strip segment;
    a first overlap region defined by the length, parallel to said x-axis, of said first microstrip extension between said proximal end of said first strip segment and said distal end of said first microstrip extension, and parallel to said z-axis from said first microstrip extension through said dielectric layer and through said first conductive layer, and terminating at said first side of said first strip segment of said first conductive layer; and
    a second overlap region defined by the length, parallel to said y-axis, of said second microstrip extension between said distal end of said fourth strip segment and said distal end of said second microstrip extension, and parallel to said z-axis from said second microstrip extension through said dielectric layer and through said first conductive layer, and terminating at said first side of said fourth strip segment of said first conductive layer.

12. The system according to claim 1, wherein each RF witness film in said plurality of RF witness films is a capacitive structure.

13. The system according to claim 1, wherein each RF witness film in said plurality of RF witness films is equally-spaced from adjacent RF witness films.

* * * * *